(12) United States Patent
Lee et al.

(10) Patent No.: US 12,433,086 B2
(45) Date of Patent: Sep. 30, 2025

(54) LIGHTING MODULE AND LIGHTING DEVICE COMPRISING SAME

(71) Applicant: LG INNOTEK CO., LTD., Seoul (KR)

(72) Inventors: Jung Ho Lee, Seoul (KR); Young Min Moon, Seoul (KR); Moo Ryong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/845,573

(22) PCT Filed: Mar. 24, 2023

(86) PCT No.: PCT/KR2023/003926
§ 371 (c)(1),
(2) Date: Sep. 10, 2024

(87) PCT Pub. No.: WO2023/182853
PCT Pub. Date: Sep. 28, 2023

(65) Prior Publication Data
US 2025/0185439 A1 Jun. 5, 2025

(30) Foreign Application Priority Data

Mar. 24, 2022 (KR) .................. 10-2022-0036925
Nov. 24, 2022 (KR) .................. 10-2022-0159639

(51) Int. Cl.
*H10H 29/00* (2025.01)
*F21K 9/61* (2016.01)
(Continued)

(52) U.S. Cl.
CPC ............ *H10H 29/857* (2025.01); *F21K 9/61* (2016.08); *F21S 41/192* (2018.01); *F21S 41/24* (2018.01);
(Continued)

(58) Field of Classification Search
CPC ............ H10H 29/857; H10H 29/8582; F21V 29/503; F21V 29/74; F21K 9/61; F21S 41/24; F21S 41/192; F21S 45/47
See application file for complete search history.

(56) References Cited

U.S. PATENT DOCUMENTS 10,337,717 B2  7/2019  Ozawa et al.
10,948,169 B2  3/2021  Kang
(Continued)

FOREIGN PATENT DOCUMENTS

KR  10-2010-0000173  1/2010
KR  10-1035483  5/2011
(Continued)

OTHER PUBLICATIONS

International Search Report dated Jun. 27, 2023 issued in Application No. PCT/KR2023/003926.

*Primary Examiner* — Gerald J Sufleta, II
(74) *Attorney, Agent, or Firm* — KED & ASSOCIATES, LLP

(57) ABSTRACT

A lighting device disclosed in an embodiment of the invention includes a heat dissipation plate having a recess portion; a circuit board accommodated in the recess portion of the heat dissipation plate and having pads; a light source portion having bonding pads; connection members respectively connecting between the pads and the bonding pads; and an adhesive member that adheres the light source portion to the heat dissipation plate. The light source portion includes a support member; light emitting devices having light emitting chips and a wavelength conversion layer; and a resin member. Each of the connection members has a ribbon shape, and a width of each of the connection members is more than twice the thickness of each of the connection members, and each of the connection members may include (Continued)

two ends respectively connected to the bonding pads and the pads, and a center portion extending convexly between the two ends.

20 Claims, 21 Drawing Sheets

(51) Int. Cl.
*F21S 41/19* (2018.01)
*F21S 41/24* (2018.01)
*F21S 45/47* (2018.01)
*F21V 19/00* (2006.01)
*F21V 29/503* (2015.01)
*F21V 29/74* (2015.01)
*H10H 29/85* (2025.01)
*F21Y 115/10* (2016.01)

(52) U.S. Cl.
CPC .......... *F21S 45/47* (2018.01); *F21V 19/0025* (2013.01); *F21V 29/503* (2015.01); *F21V 29/74* (2015.01); *H10H 29/8582* (2025.01); *F21Y 2115/10* (2016.08)

(56) References Cited

U.S. PATENT DOCUMENTS

| | | | |
|---|---|---|---|
| 2009/0316409 | A1 | 12/2009 | Kim et al. |
| 2013/0141941 | A1 | 6/2013 | Matsui |
| 2015/0001557 | A1* | 1/2015 | Yoon .................... H05K 1/0204 |
| | | | 438/27 |
| 2016/0290621 | A1 | 10/2016 | Ozawa et al. |
| 2017/0082257 | A1* | 3/2017 | Yoon ........................ F21S 43/15 |
| 2017/0167714 | A1* | 6/2017 | Hong ....................... F21V 29/74 |
| 2017/0179355 | A1* | 6/2017 | Oka ....................... H01R 24/66 |
| 2019/0086049 | A1* | 3/2019 | Onoda .................... F21S 41/16 |
| 2019/0203904 | A1 | 7/2019 | Lee et al. |
| 2020/0080716 | A1 | 3/2020 | Mertens et al. |

FOREIGN PATENT DOCUMENTS

| | | |
|---|---|---|
| KR | 10-2012-0137307 | 12/2012 |
| KR | 10-2014-0055360 | 5/2014 |
| KR | 10-2017-0035028 | 3/2017 |
| KR | 10-2019-0082567 | 7/2019 |
| KR | 10-2020-0027196 | 3/2020 |
| KR | 10-2021-0152792 | 12/2021 |
| KR | 10-2021-0155453 | 12/2021 |

* cited by examiner

[FIG. 1]
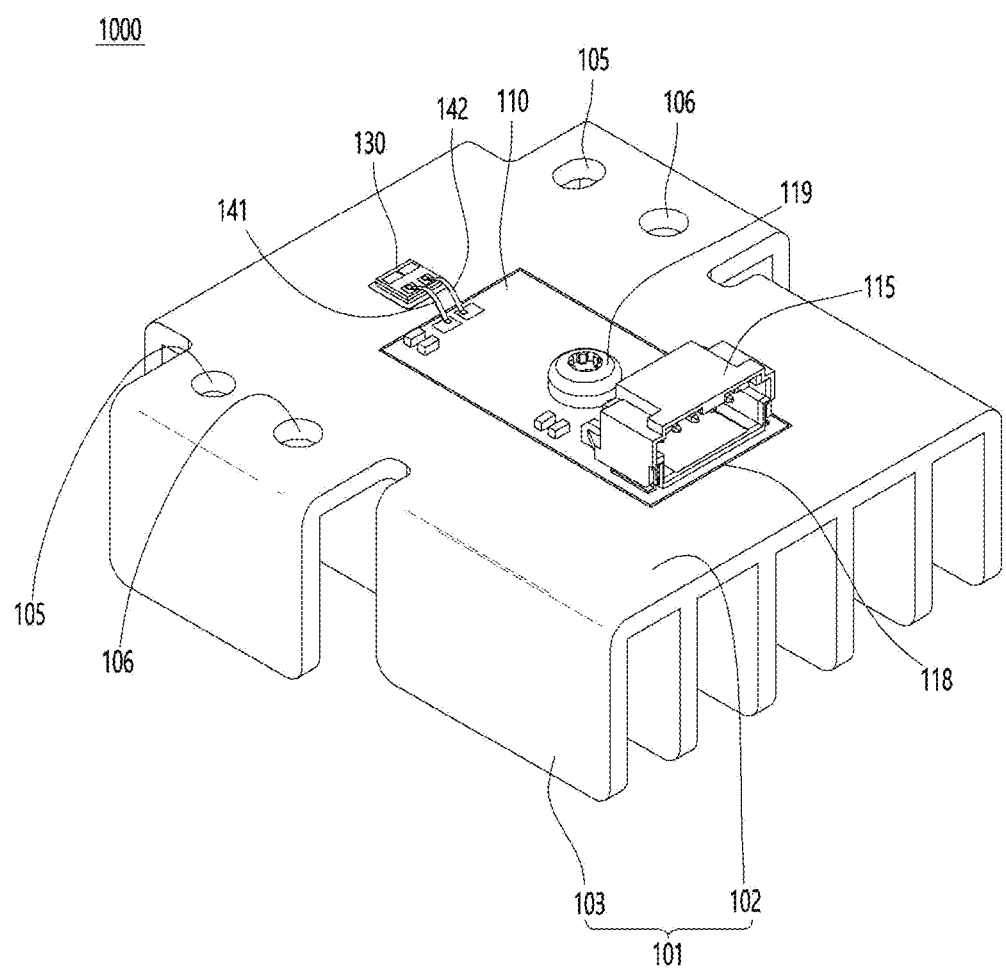

[FIG. 2]
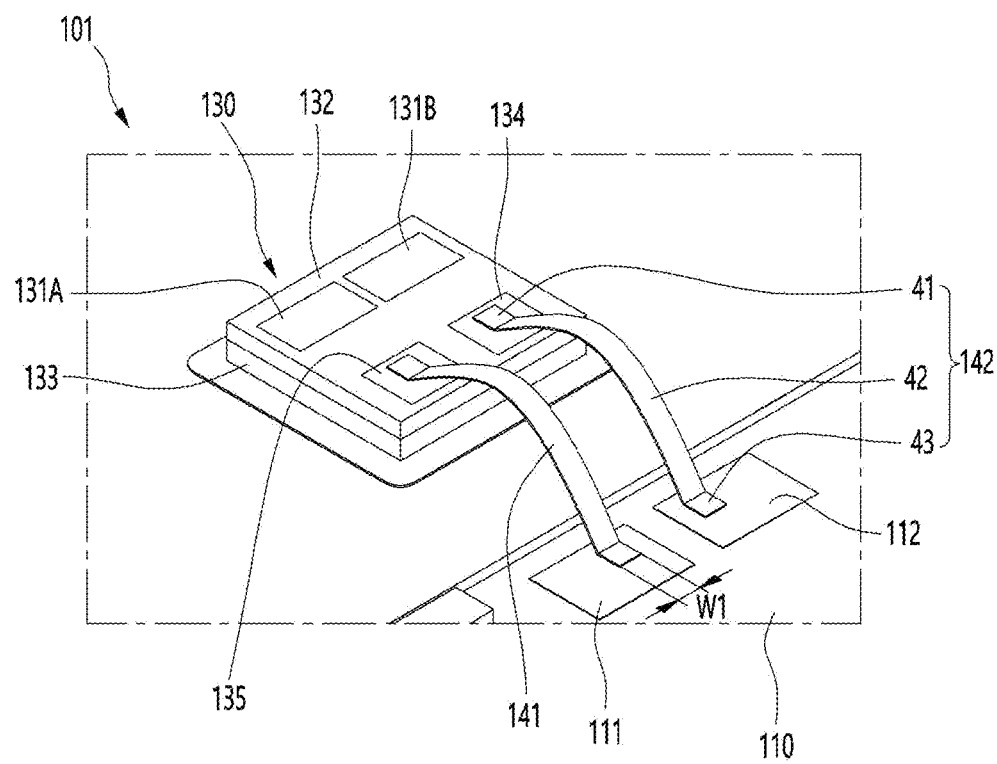
[FIG. 3]
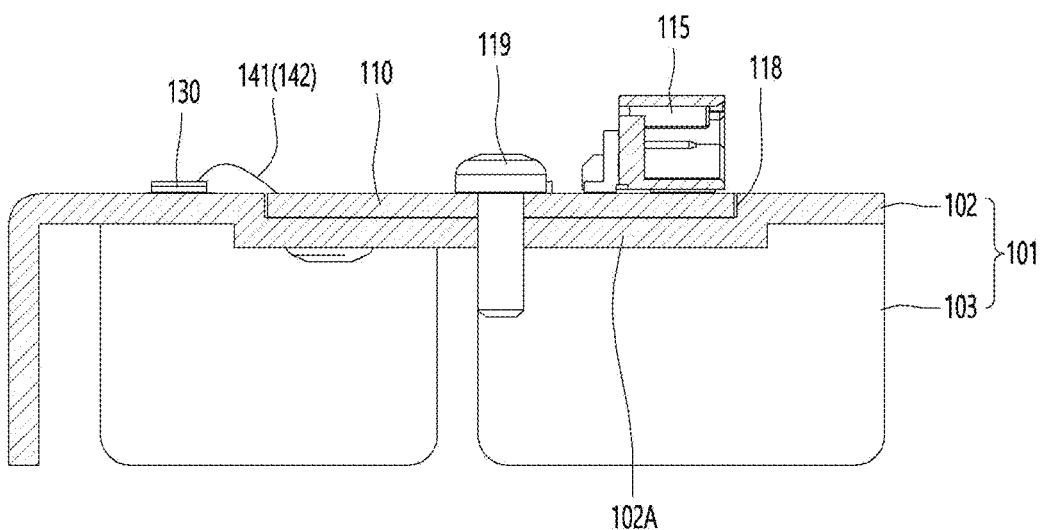

[FIG. 4]
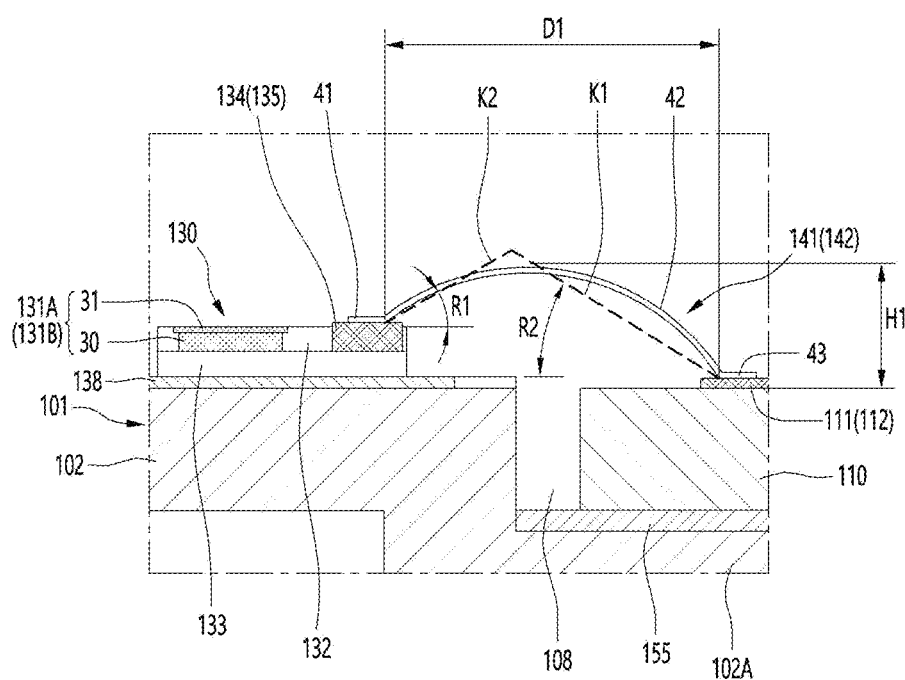

[FIG. 5]
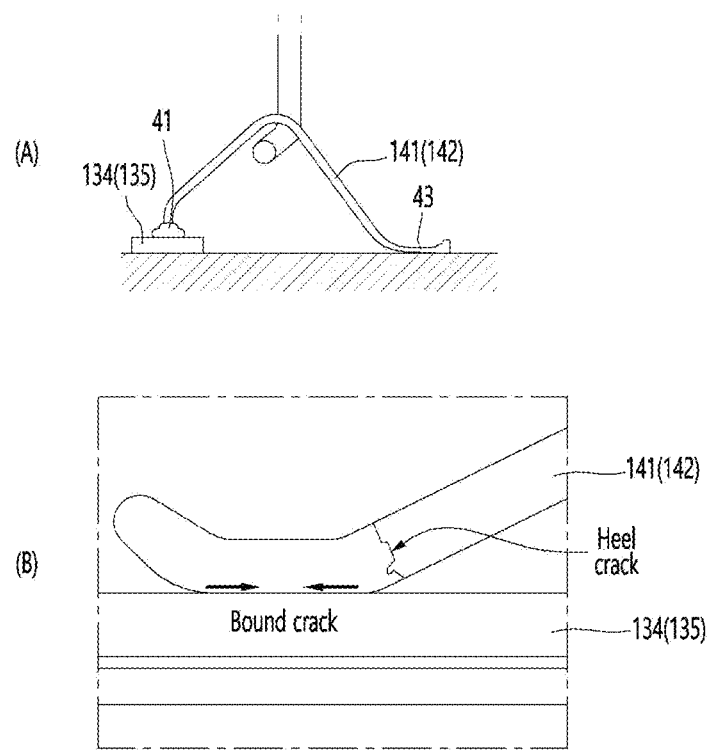

[FIG. 6]
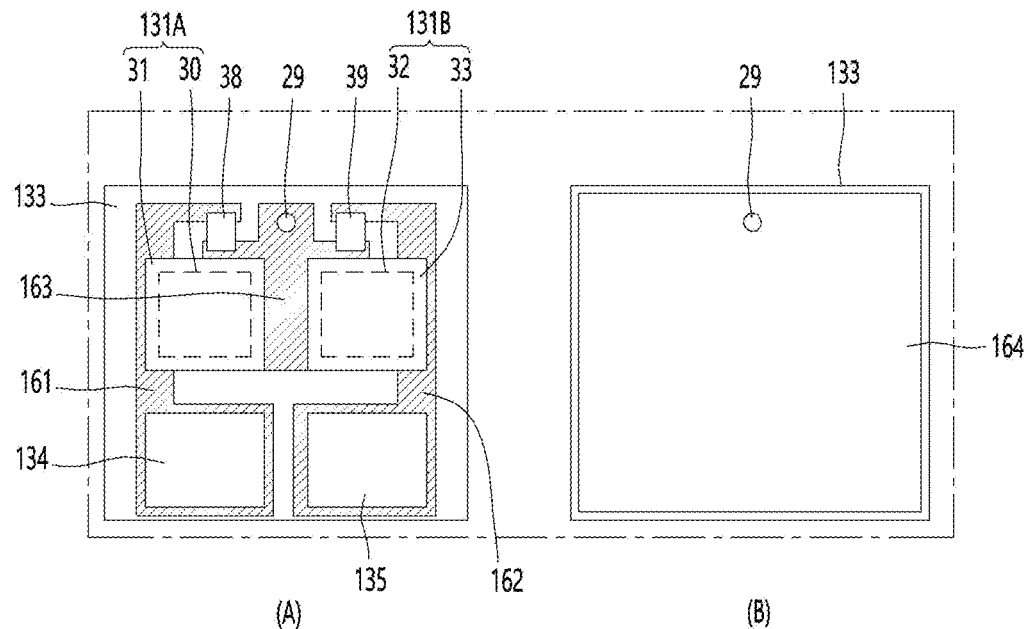
[FIG. 7]
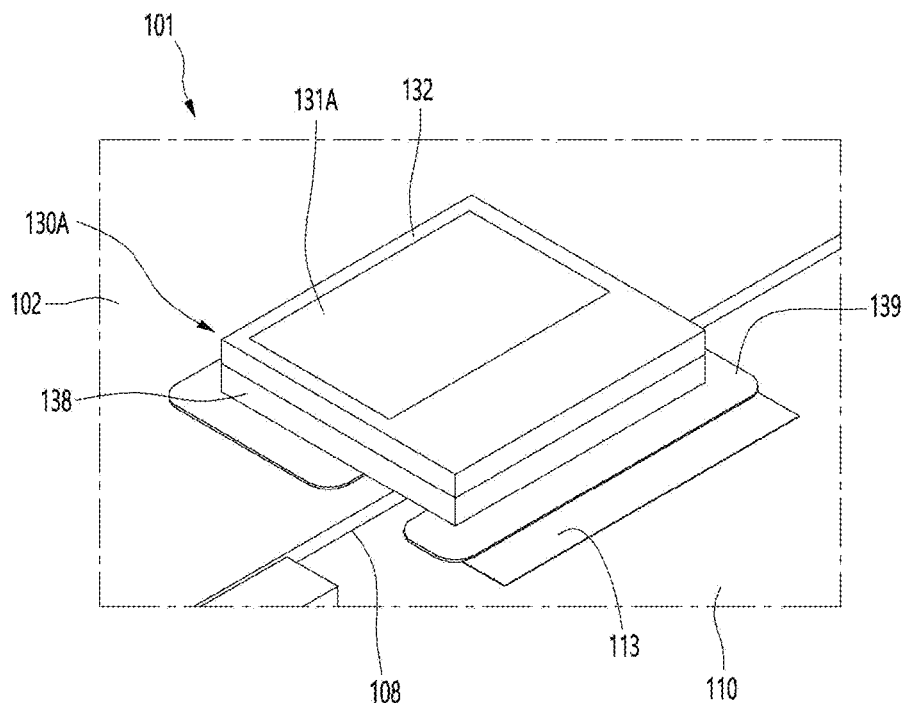

【FIG. 8】
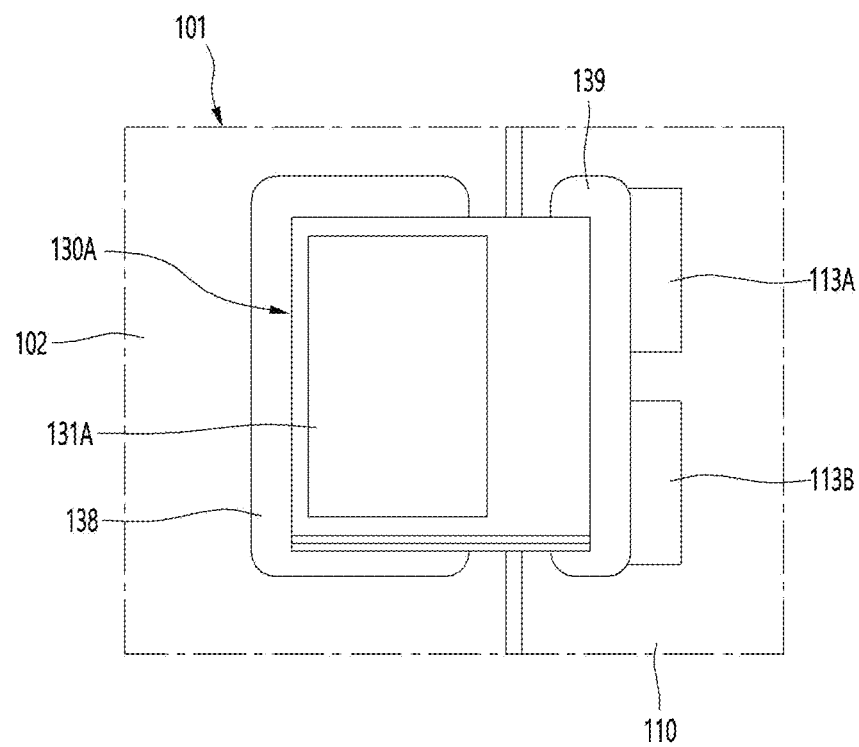
【FIG. 9】
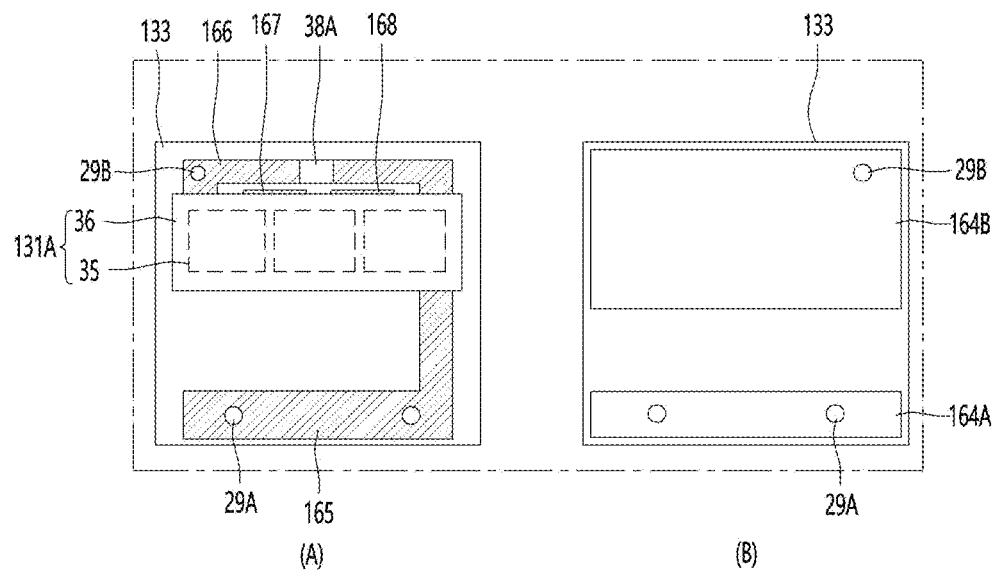

[FIG. 10]
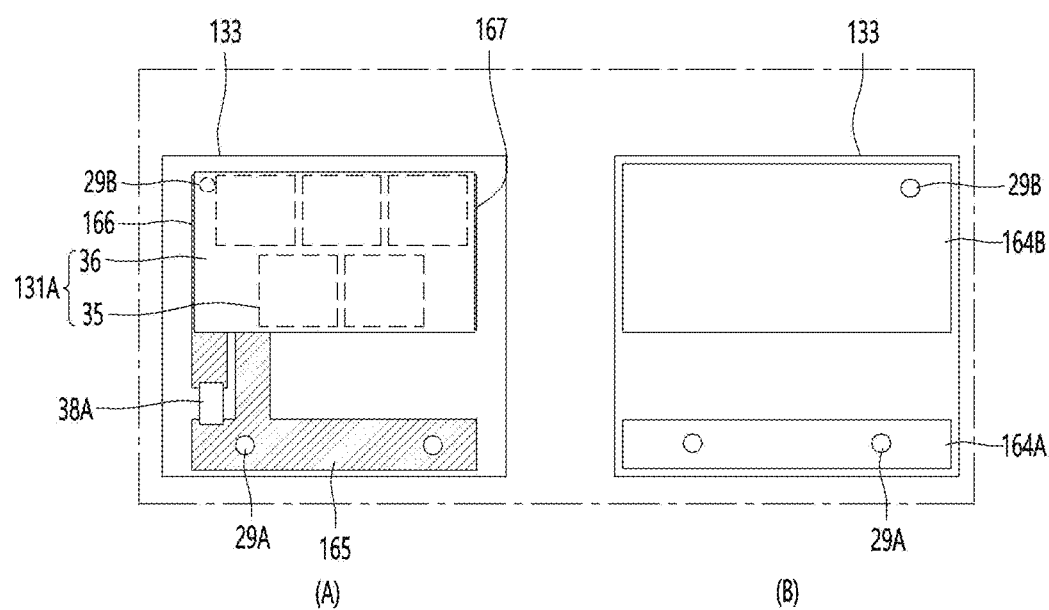

[FIG. 11]
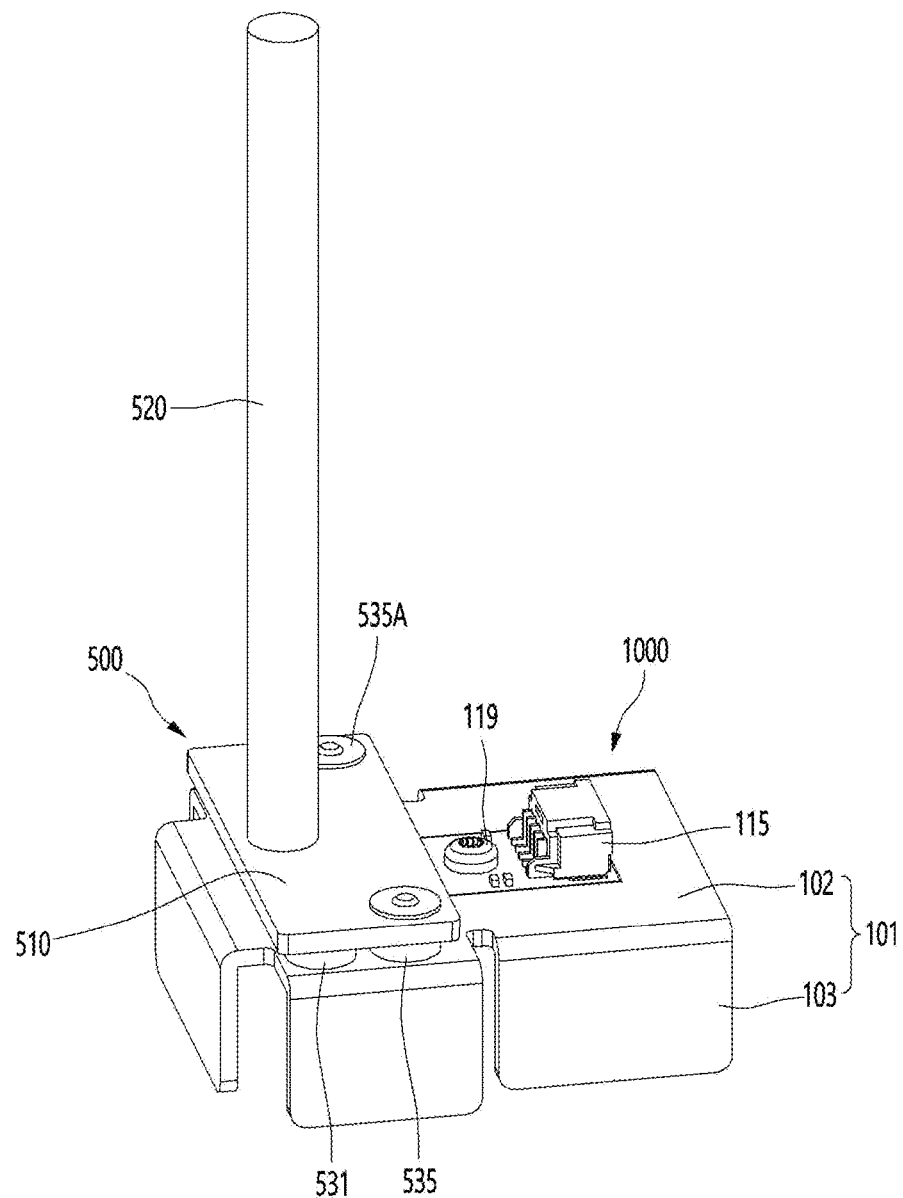

【FIG. 12】
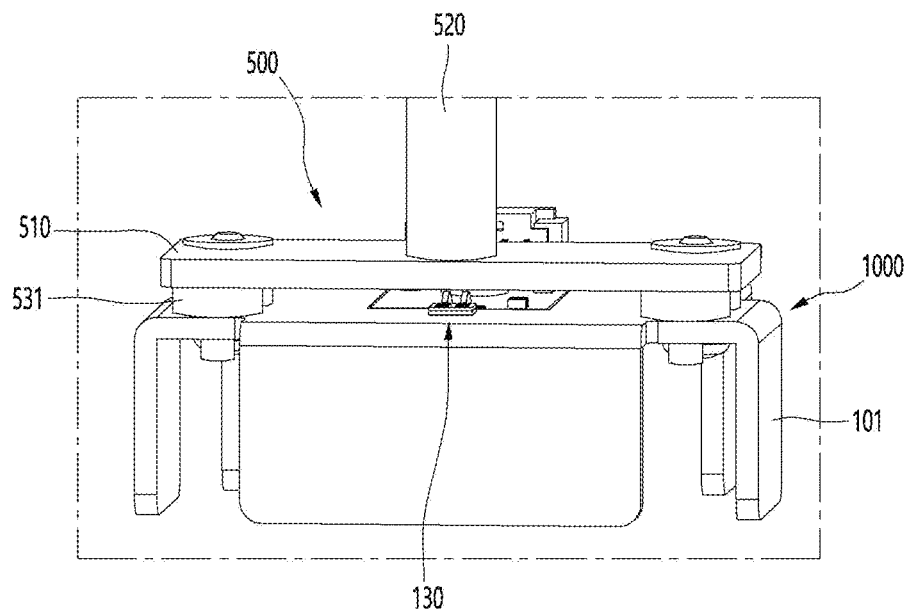
【FIG. 13】
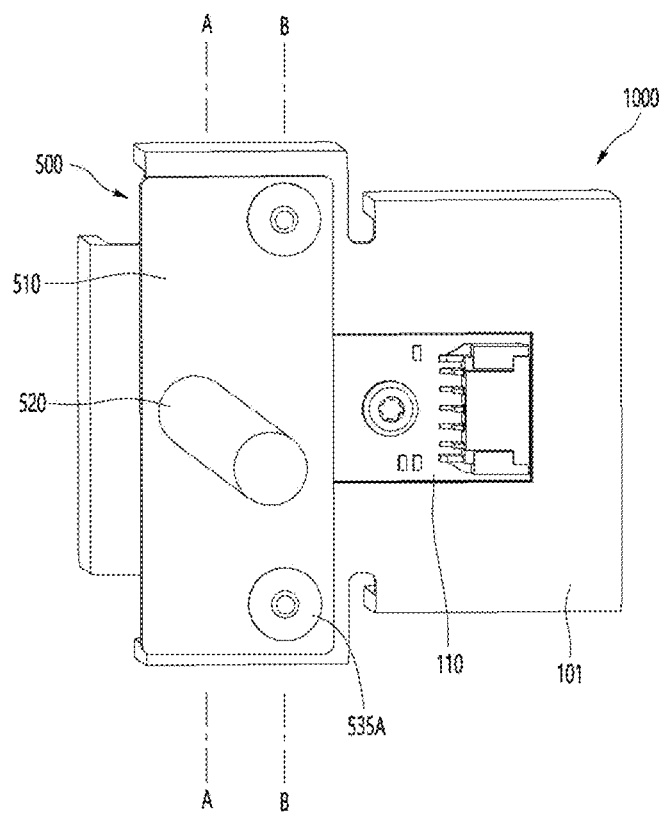

【FIG. 14】
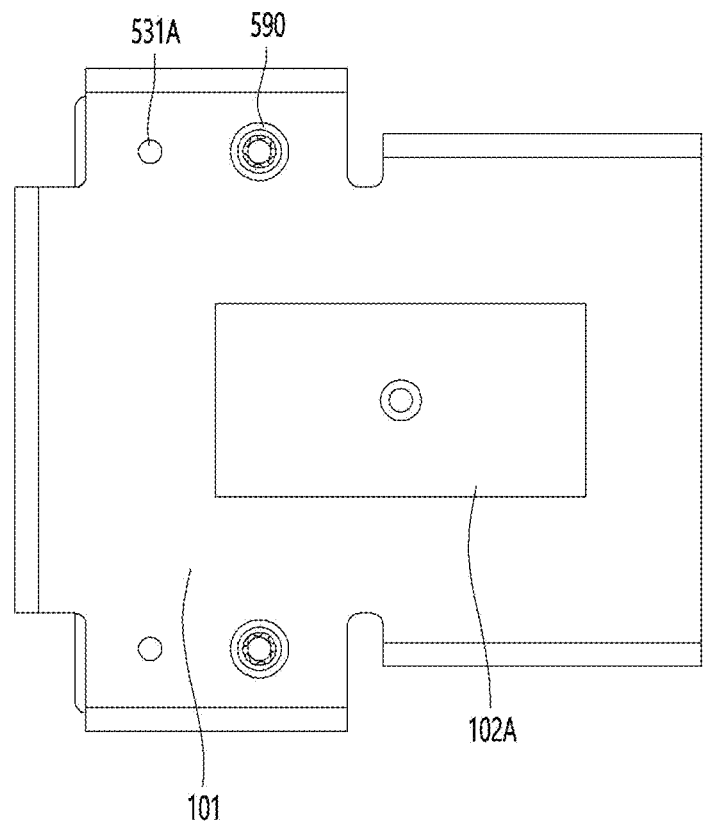
【FIG. 15】
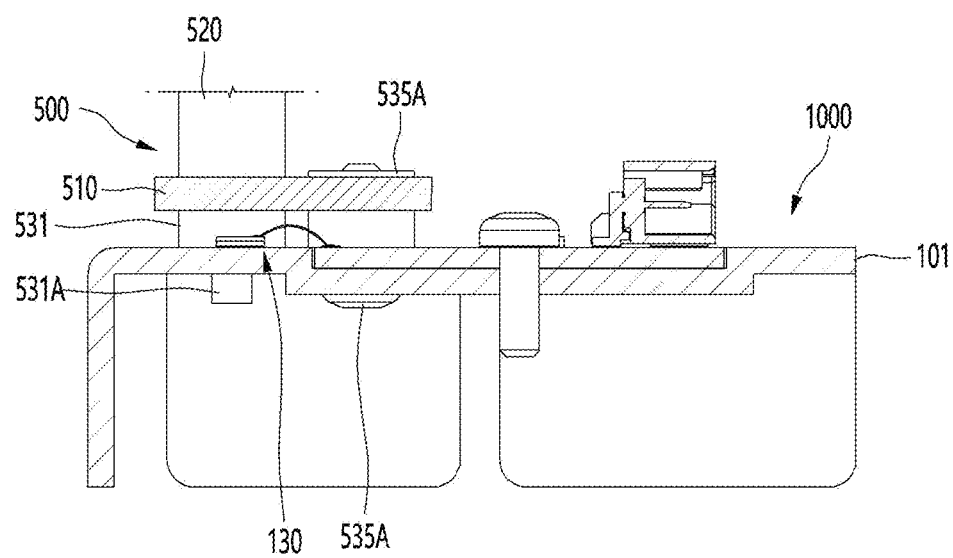

[FIG. 16]
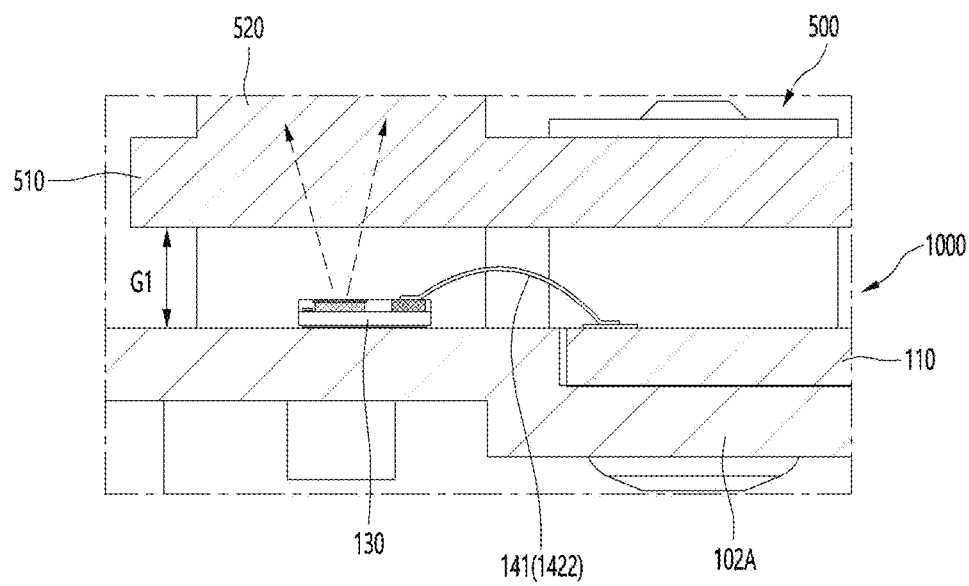
[FIG. 17]
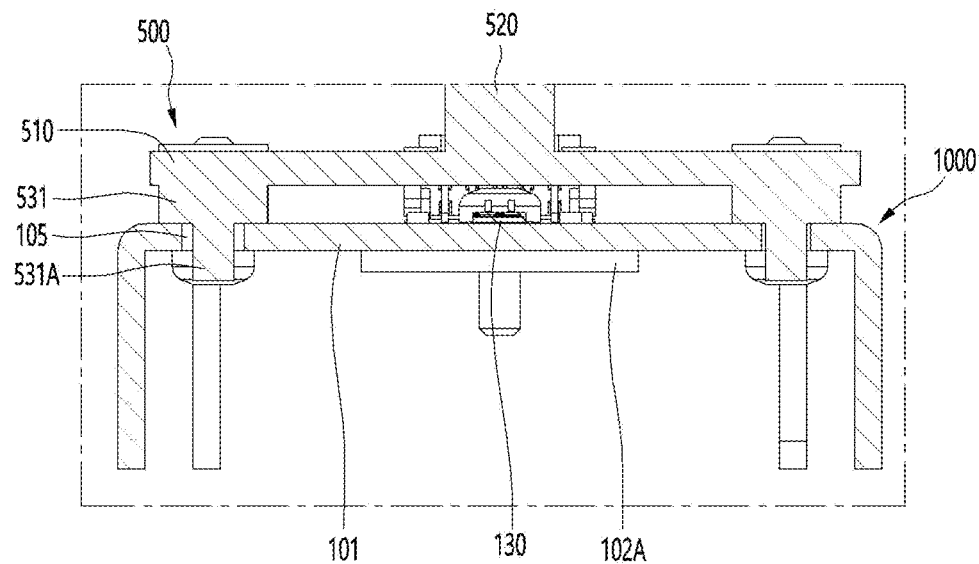

【FIG. 18】
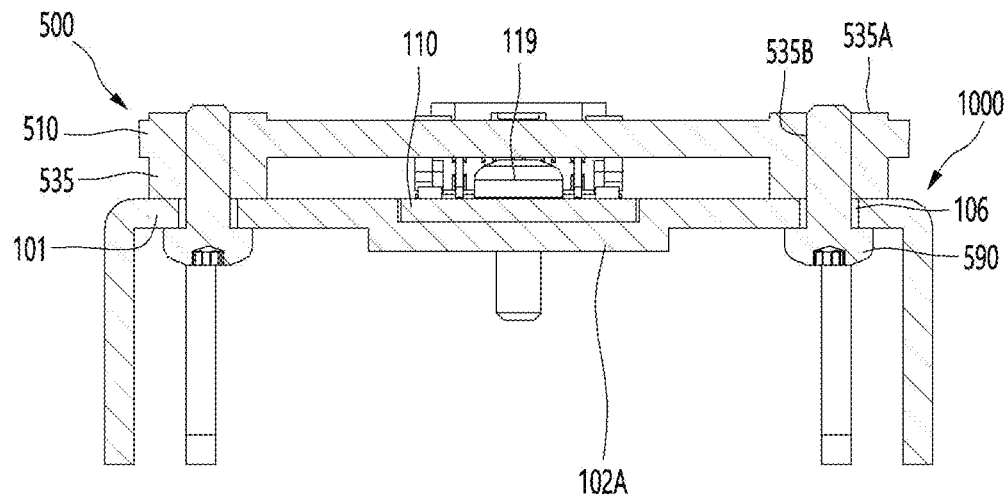
【FIG. 19】
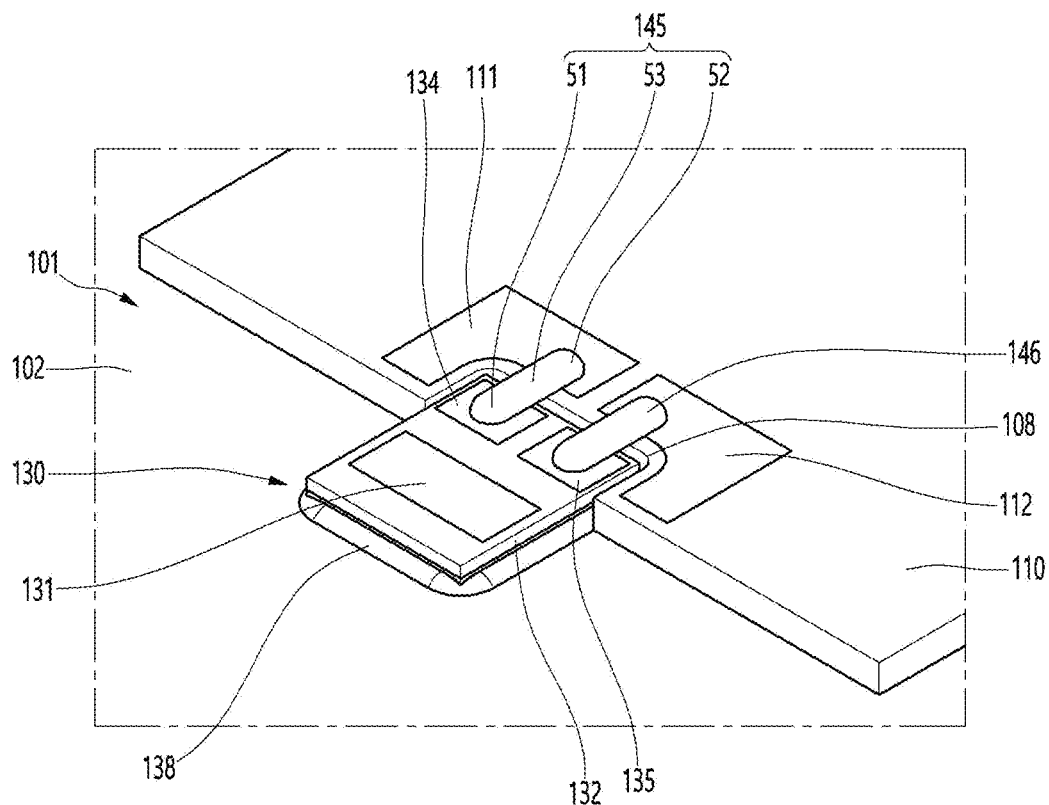

[FIG. 20]
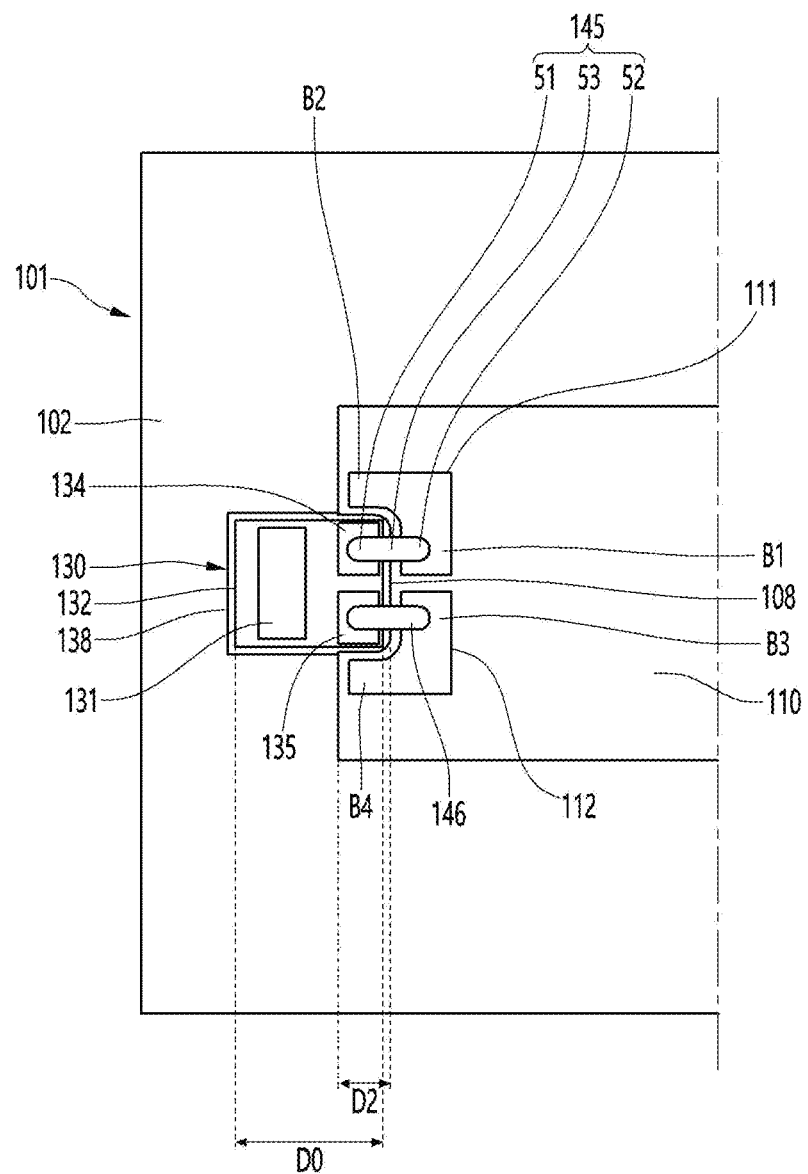

[FIG. 21]
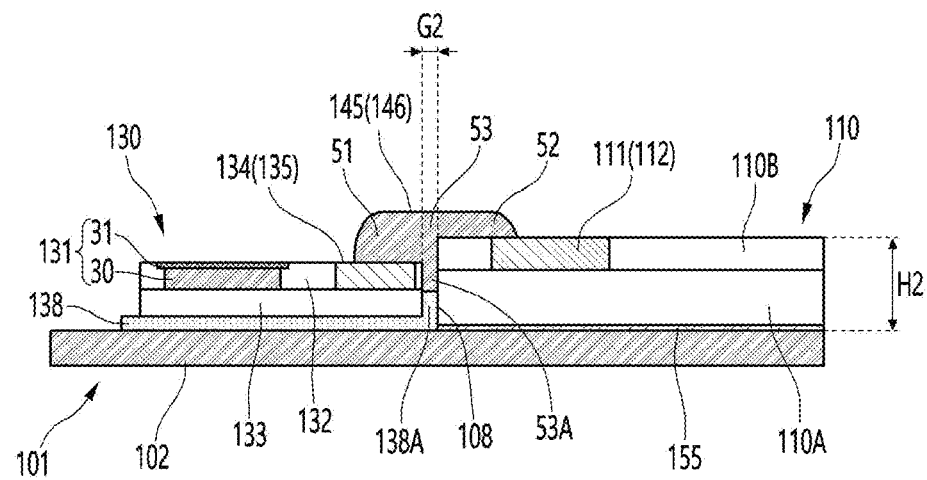
[FIG. 22]
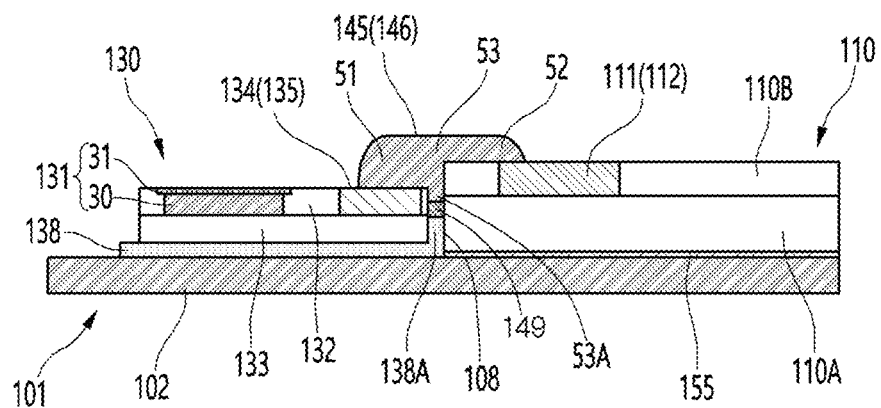

[FIG. 23]
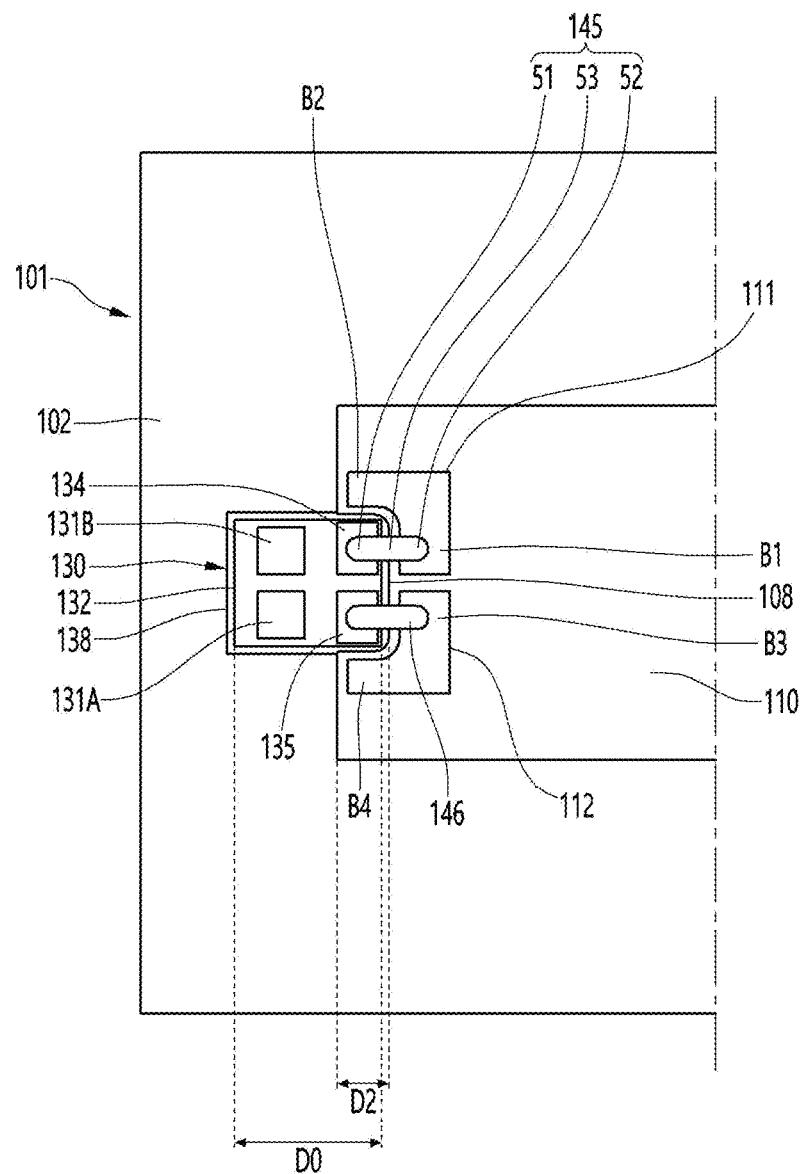

【FIG. 24】
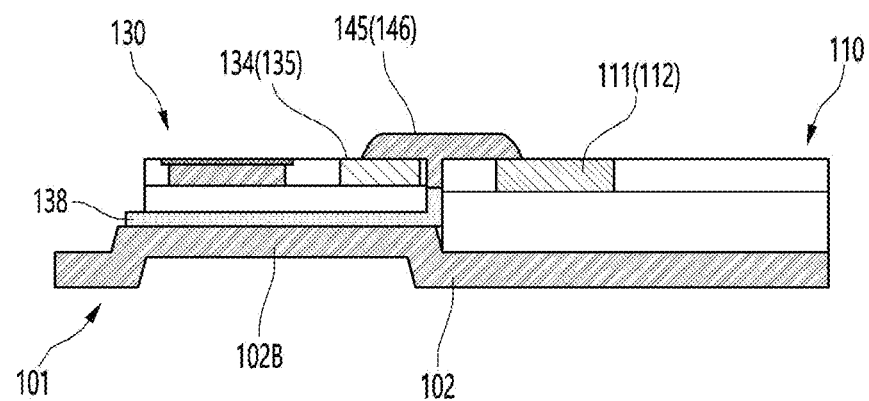
【FIG. 25】
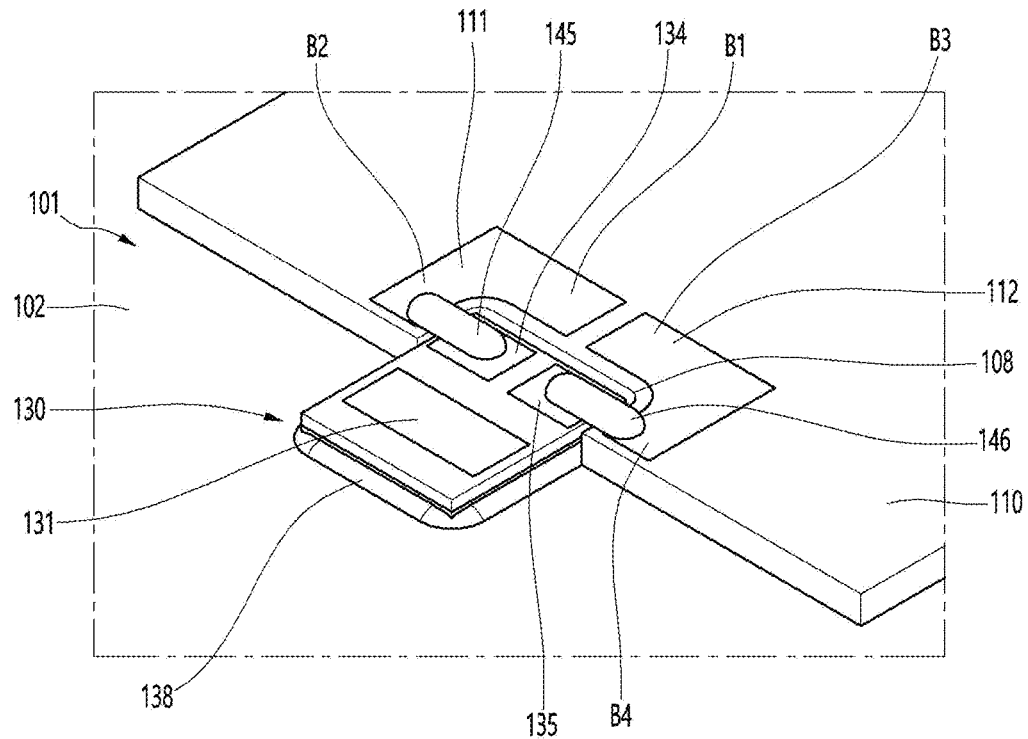

[FIG. 26]
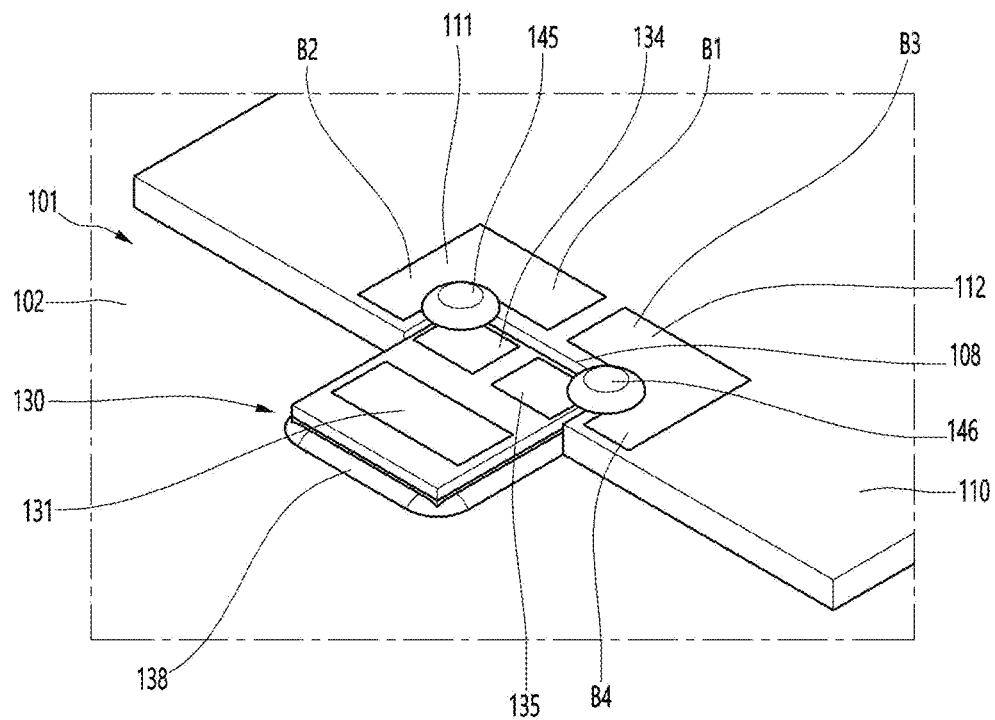

[FIG. 27]
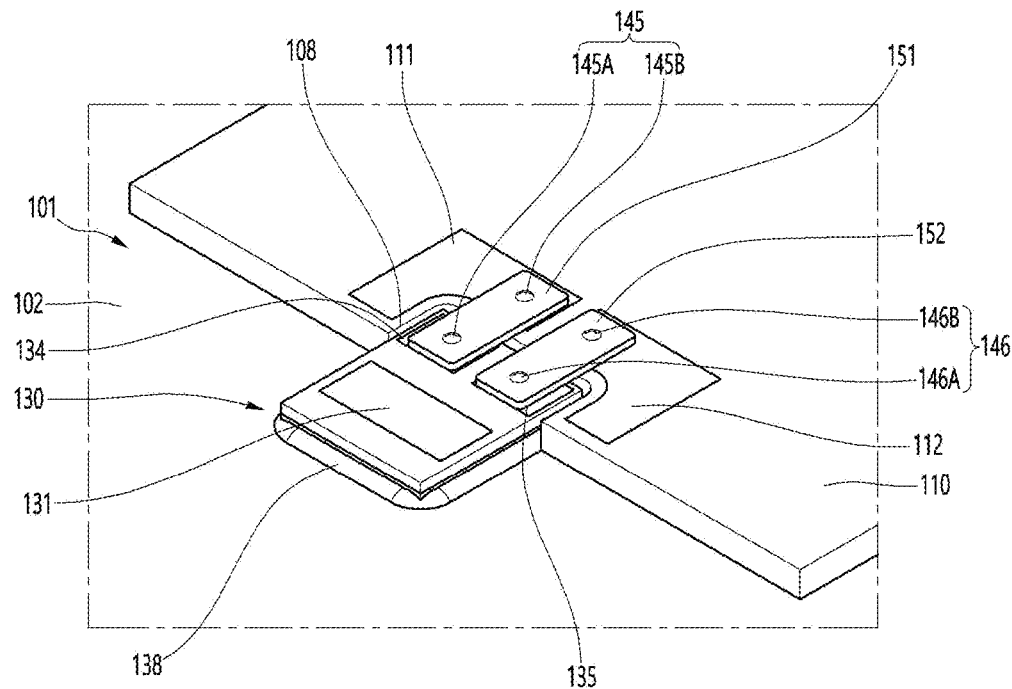
[FIG. 28]
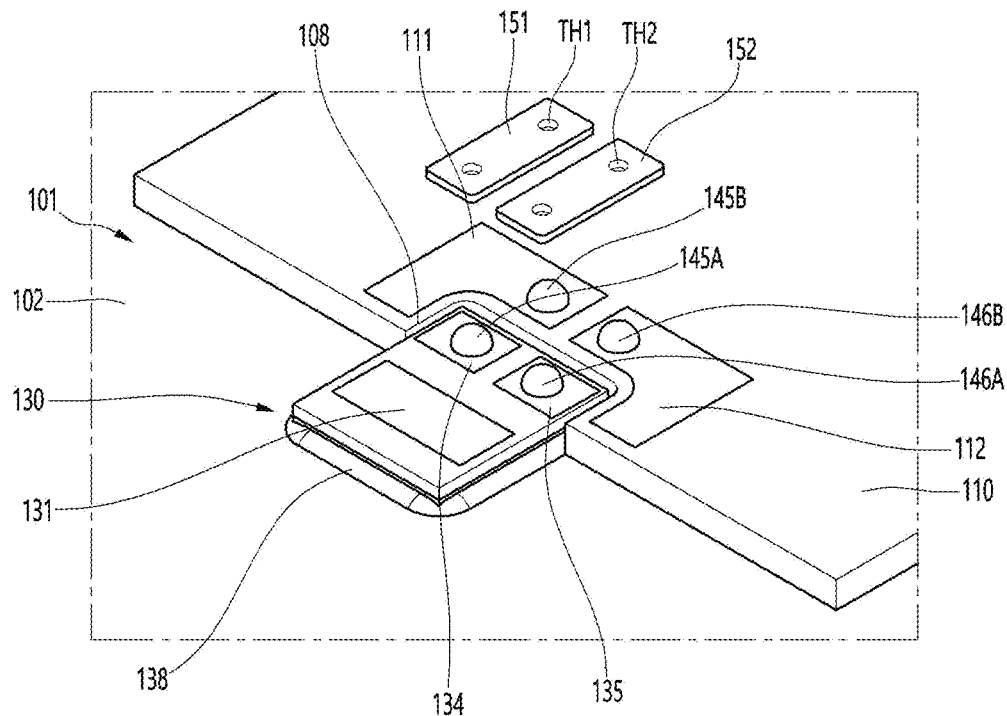

[FIG. 29]
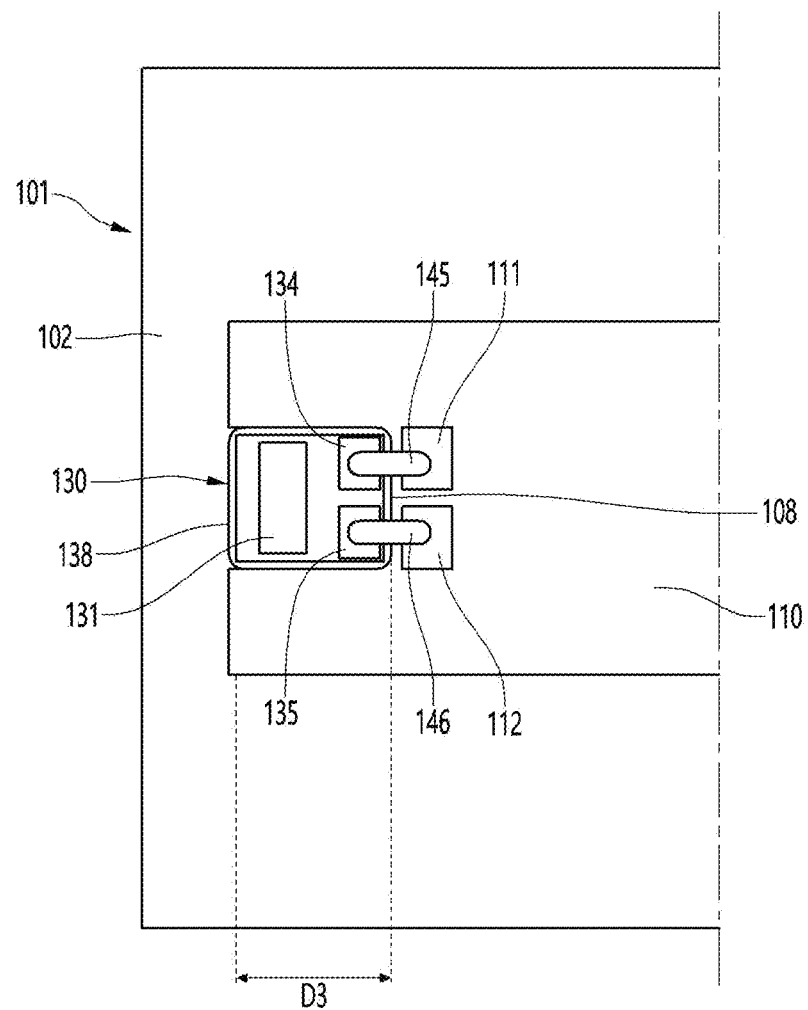

[FIG. 30]
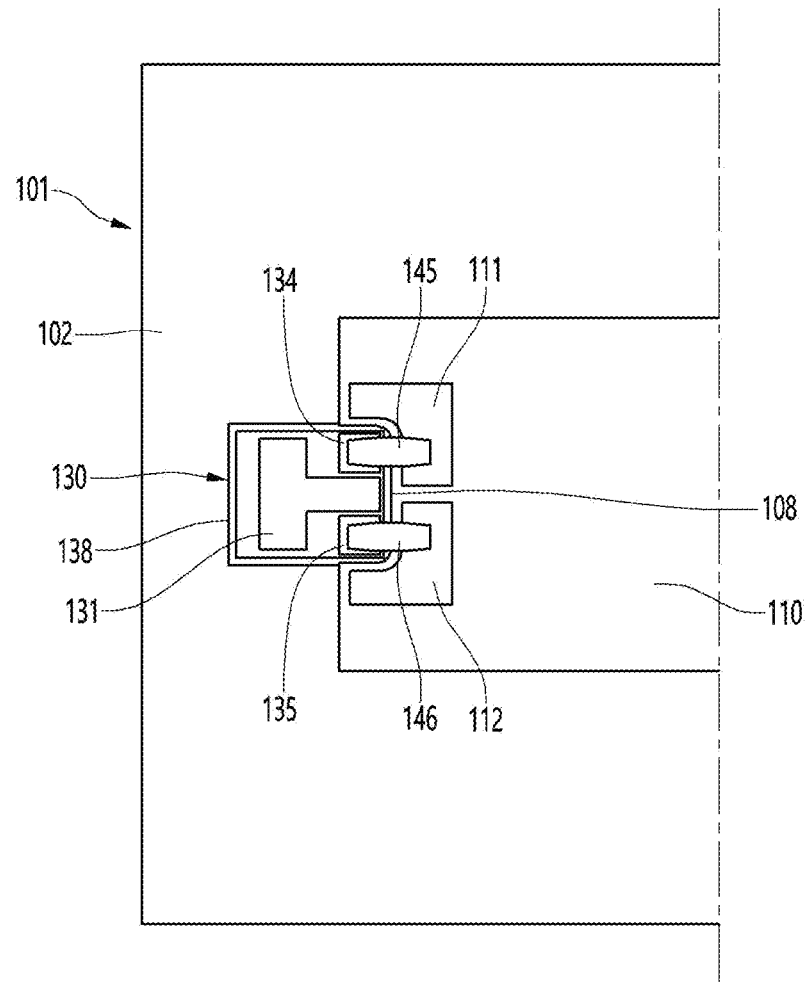

[FIG. 31]
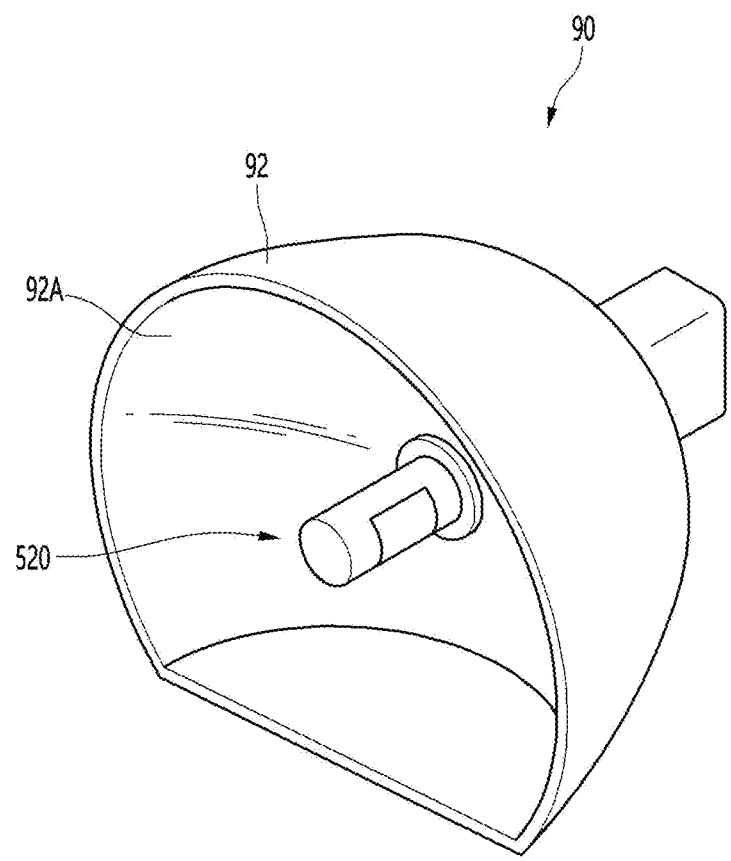

LIGHTING MODULE AND LIGHTING DEVICE COMPRISING SAME

CROSS-REFERENCE TO RELATED PATENT APPLICATIONS

This application is a U.S. National Stage Application under 35 U.S.C. § 371 of PCT Application No. PCT/KR2023/003926, filed Mar. 24, 2023, which claims priority to Korean Patent Application Nos. 10-2022-0036925, filed Mar. 24, 2022 and 10-2022-0159639, filed Nov. 24, 2022, whose entire disclosures are hereby incorporated by reference.

TECHNICAL FIELD

The embodiment relates to a lighting module and a lighting device having the same.

BACKGROUND ART

Lighting applications include vehicle lights as well as backlights for displays and signs. Light emitting device, such as light emitting diode (LED), have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since an emission angle of light emitted from the light emitting diode is small, when the light emitting diode is used as a vehicle lamp, there is a demand for increasing the light emitting area of the lamp using the light emitting diode. Light emitting diodes can increase the design freedom of lamps because of their small size, and they are also economical because of their semi-permanent lifespan.

DISCLOSURE

Technical Problem

An embodiment of the invention may provide a lighting module having a light source portion for improving heat dissipation efficiency and preventing cracks in a connection member, and a lighting device having the same. An embodiment of the invention may provide a lighting module that flip-bonds a plurality of light emitting chips or a light source portion that emits a plurality of colors, and a lighting device having the same.

An embodiment of the invention provides a lighting module in which at least a portion of a light source portion having a light emitting device is coupled to a portion of a circuit board, and a lighting device having the same. An embodiment of the invention provides a lighting module in which a light source portion disposed on a heat dissipation plate and a pad of a circuit board are connected by a connection member, and the connection member is located further inside than one side of the circuit board.

Technical Solution

A lighting device according to an embodiment of an invention comprises: a heat dissipation plate having an upper surface and a recess portion concave from an upper surface; a circuit board accommodated in the recess portion of the heat dissipation plate and having a plurality of pads; a light source portion disposed on the heat dissipation plate adjacent to the circuit board and having a plurality of bonding pads; a plurality of connection members connecting the plurality of pads to the plurality of bonding pads, respectively; and an adhesive member that adheres the light source portion to the heat dissipation plate, wherein the light source portion comprises: a support member; a plurality of light emitting devices having a plurality of light emitting chips on the support member and a wavelength conversion layer on the plurality of light emitting chips; and a resin member covering a periphery of the plurality of light emitting devices, wherein the plurality of bonding pads have a thickness thicker than a thickness of the light emitting chip and are sealed to the resin member so as to be exposed on an upper surface of the resin member, each of the plurality of connection members has a ribbon shape, a width of each of the plurality of connection members is more than twice a thickness of the connection member, and each of the plurality of connection members may include one end bonded to each of the plurality of bonding pads, the other end connected to each of the plurality of pads, and a center portion convexly extended from the one end toward the other end.

According to an embodiment of the invention, a length between the one end and the other end of each of the plurality of connection members may be greater than the width of each of the plurality of connection members. The width of each of the plurality of connection members may be in a range of 0.4 mm to 0.9 mm, and a length of one side of each of the plurality of bonding pads may be in a range of 1.5 to 4 times the width.

According to an embodiment of the invention, an upper surface of the circuit board is disposed lower than an upper surface of the plurality of light emitting chips, and a height of a high point of each of the plurality of connection members may be smaller than a straight distance between the one end and the other end of each of the connection members.

According to an embodiment of the invention, the support member may include an upper electrode pattern on which the plurality of light emitting chips is disposed; and a lower electrode pattern electrically connected to a portion of the plurality of electrode patterns and the heat dissipation plate.

According to an embodiment of the invention, the adhesive member includes a first adhesive member that adheres the first bonding pad of the light source portion to the heat dissipation plate; and a second adhesive member that adheres the second bonding pad of the light source portion to the pad of the circuit board, and at least one of the first and second adhesive members may be made of an electrically conductive material.

According to an embodiment of the invention, a light guide module that is coupled to the heat dissipation plate and covers the light source portion includes, the light guide module includes a support portion that is coupled to the heat dissipation plate and is spaced apart from the light source portion; and a light guide portion protruding from the support portion, wherein the light guide portion overlaps the light source portion in a vertical direction, and the light guide portion may have a columnar shape and may have an upper surface with an area larger than an area of an upper surface of the light source portion.

A lighting device according to an embodiment of the invention includes a heat dissipation plate; a circuit board disposed on the heat dissipation plate and having a concave recess portion on one side; a plurality of pads disposed on one side of the circuit board; a light source portion disposed on the heat dissipation plate and having a light emitting device and a plurality of bonding pads; and a plurality of connection members respectively connecting the plurality of pads to the plurality of bonding pads, and at least a portion of the light source portion may be inserted into the recess portion.

According to an embodiment of the invention, the light source portion has a light emitting device disposed on one side and first and second bonding pads disposed on the other side, and the pads of the circuit board include first and second pads disposed on an outside of the recess portion, and the first pad may face at least two side surfaces of the first bonding pad, and the second pad may face at least two side surfaces of the second bonding pad.

According to an embodiment of the invention, the recess portion may be concave from one side to the other side of the circuit board, and a depth of the recess portion may be 30% or more of a length of the light source portion in a first direction. An adhesive member disposed between the light source portion and the heat dissipation plate may include, and at least a portion of the plurality of connection members may be disposed on the recess portion, and a portion of the adhesive member may protrude into a gap between the light source portion and the heat dissipation plate, and a portion of each of the plurality of connection members may protrude into the gap between the light source portion and the heat dissipation plate.

Advantageous Effects

An embodiment of the invention can prevent the crack problem of ribbon-shaped connection members(s) connected to light emitting devices in a lighting device. The embodiment of the invention can improve the brightness and color of the lighting device. The embodiment of the invention can improve the heat dissipation efficiency by flip-bonding the light source portion. The embodiment of the invention can improve the reliability of the lighting module and the lighting device having the same.

According to the embodiment of the invention, at least a portion of the light source portion having the light emitting device is disposed inside one side of the circuit board, thereby improving electrical reliability between the light source portion and the circuit board. According to an embodiment of the invention, at least a portion of the light source portion having the light emitting device is located inside one side of the circuit board, thereby reducing the connection distance between the light source portion and the circuit board. The embodiment of the invention can improve the reliability of the lighting module and the lighting device having the same.

DESCRIPTION OF DRAWINGS

FIG. 1 is a perspective view of a lighting device according to the first embodiment.

FIG. 2 is a partially enlarged view of the lighting device of FIG. 1.

FIG. 3 is a side cross-sectional view of the lighting device of FIG. 1.

FIG. 4 is a partially enlarged view of the lighting device of FIG. 3.

FIGS. 5 (A) and (B) are drawings showing a wire pulling test and an example of crack occurrence of the lighting device of FIG. 3.

FIGS. 6 (A) and (B) are front and rear views showing another example of the light source portion of FIG. 2.

FIG. 7 is a perspective view of a lighting device according to the second embodiment.

FIG. 8 is another example of the lighting device of FIG. 7.

FIGS. 9 (A) and (B) are front and rear views showing the light emitting chips of the light source portion of FIG. 7.

FIGS. 10 (A) and (B) are front and rear views showing the light emitting chips of the light source portion of FIG. 7.

FIG. 11 is an example of a lighting device in which a light guide module is combined on a lighting module disclosed in an embodiment of the invention.

FIG. 12 is a side view of the lighting device of FIG. 11.

FIG. 13 is a plan view of the lighting device of FIG. 11.

FIG. 14 is a rear view of the lighting device of FIG. 11.

FIG. 15 is a partial side sectional view of the lighting device of FIG. 11.

FIG. 16 is a drawing explaining an example of a light path of the lighting device of FIG. 11.

FIG. 17 is an A-A side sectional view of the lighting device of FIG. 13.

FIG. 18 is a B-B side sectional view of the lighting device of FIG. 13.

FIG. 19 is a partial enlarged view showing another example of the lighting device of FIG. 1.

FIG. 20 is a partial plan view of the lighting device of FIG. 19.

FIG. 21 is a side sectional view of the lighting device of FIG. 19.

FIG. 22 is another example of the lighting device of FIG. 20.

FIG. 23 is another example of the lighting device of FIG. 21.

FIG. 24 is another example of the lighting device of FIG. 21.

FIGS. 25 to 27 are modified examples of the lighting device according to an embodiment of the invention.

FIG. 28 is a drawing before the connection frame of the lighting device of FIG. 27 is combined.

FIG. 29 is a modified example of the lighting device of FIG. 19.

FIG. 30 is another example of the lighting device of FIG. 19.

FIG. 31 is a perspective view of a headlamp to which the lighting device according to an embodiment of the invention is applied.

BEST MODE

Hereinafter, preferred embodiments of the invention will be described in detail with reference to the accompanying drawings. The technical idea of the present invention is not limited to some of the described embodiments, but can be implemented in various different forms, and if it is within the scope of the technical idea of the present invention, one or more of its components may be selectively combined and substituted between embodiments. In addition, terms (including technical and scientific terms) used in the embodiments of the present invention, unless explicitly specifically defined and described, may be interpreted as a meaning that may be generally understood by those skilled in the art to which the present invention belongs, and terms generally used, such as terms defined in the dictionary, may be interpreted in consideration of the context of the related technology. Terms used in the embodiments of the present invention are for describing the embodiments and are not intended to limit the present invention. In the present specification, the singular form may include a plural form unless specifically described in the phrase, and may include at least one of all combinations that may be combined as A, B, and C when described as "A and/or at least one (or more than one) of B and C". Also, terms such as first, second, A, B, (a), and (b) may be used to describe components of an embodiment of the present invention. These terms are intended only to distinguish the components from other components and are not determined by their nature, sequence, or order. Also, when a component is described as being 'connected', 'coupled' or 'connected' to another component, not only when the component is directly connected, coupled or connected to another component, it may also be 'connected', 'coupled', or 'connected' due to another component between that component and the other component. In addition, when each component is described as being formed or disposed "up (above) or down (bottom)", the up (down) or down (bottom) includes not only when two components are in direct contact with each other, but also when one or more components are formed or disposed between two components. Also, when expressed as "up (above) or down (bottom)", it may include the meaning of not only the upward direction but also the downward direction based on one component.

The lighting device 1000 disclosed in the embodiment can be applied to various lamp devices requiring lighting, such as vehicle lamps, household lighting devices, and industrial lighting devices. For example, when applied to vehicle lamps, it can be applied to head lamps, side mirror lights, side maker lights, fog lights, tail lamps, brake lights, daytime running lights, vehicle interior lights, door scars, rear combination lamps, backup lamps, and the like. The lighting device can also be applied to indoor and outdoor advertising devices, display devices, and various types of electric vehicles.

First Embodiment

FIG. 1 is a perspective view of a lighting device according to the first embodiment, FIG. 2 is a partially enlarged view of the lighting device of FIG. 1, FIG. 3 is a side cross-sectional view of the lighting device of FIG. 1, FIG. 4 is a partially enlarged view of the lighting device of FIG. 3, FIG. 5(A)(B) is drawings showing a wire pulling test and an example of crack occurrence of the lighting device of FIG. 3, and FIG. 6(A)(B) is front and rear views showing another example of the light source portion of FIG. 2.

Referring to FIGS. 1 to 6, the lighting device 1000 may include a heat dissipation plate 101, a circuit board 110 disposed on a first region of the heat dissipation plate 101, a light source portion 130 disposed on a second region of the heat dissipation plate 101, and a ribbon-shaped connection member 141 and 142 connecting the light source portion 130 and the circuit board 110. The light source portion 130 may be a lighting module that emits a single color or multiple colors. The light source portion 130 may be a lighting module having a single LED chip or multiple LED chips and a wavelength conversion layer.

The heat dissipation plate 101 may be disposed under the circuit board 110. The heat dissipation plate 101 may be disposed under the circuit board 110 and the light source portion 130. The heat dissipation plate 101 supports the circuit board 110 and can conduct heat generated from the circuit board 110. The heat dissipation plate 101 may be formed of metal or may be formed by a laminated structure of a thermally conductive material and a metal layer. The heat dissipation plate 101 may be formed as a single layer or multiple layers. The heat conductive material may include a ceramic material, AlN, or an aluminum material having an anodized surface layer. The metal may include at least one of Al, Ni, Mo, Cu, Cu-alloy, Cu—W, Ag, or Au.

The heat dissipation plate 101 includes a heat dissipation portion 102 and a side portion 103, and the heat dissipation portion 102 may include a substrate heat dissipation portion 102A having a recess portion 108 into which the circuit board 110 is inserted. The heat dissipation portion 102 may have an area larger than that of the circuit board 110, for example, an area that is twice or ten times larger. The heat dissipation plate 101 may include a coupling hole 105 and 106. The coupling holes 105 and 106 may be disposed on both sides of the light source portion 130. The light guide module (500, FIG. 11) described below may be coupled to the coupling holes 105 and 106.

The circuit board 110 is inserted into a concave recess portion 108 from the heat dissipation portion 102 and faces the substrate heat dissipation portion 102A. The lower surface of the circuit board 110 may be adhered to the substrate heat dissipation portion 102A with an adhesive film 155. The lower surface of the circuit board 110 may be positioned lower than the upper surface of the heat dissipation plate 101. The adhesive film 155 may include a thermally conductive adhesive. The adhesive film 155 may be adhered to the lower surface and side surfaces of the circuit board 110.

Since the circuit board 110 is inserted into the recess portion 108, it may be adjacent to a horizontal straight line extending from the upper surface of the circuit board 110 and the upper surface of the heat dissipation portion 102. Here, when the circuit board 110 is disposed on the upper surface of the heat dissipation portion 102, the high point position of the connection member 141 and 142 becomes higher, and in this case, the gap between the light source portion 130 and the light guide module (500, FIG. 11) increases further, and as a result, the efficiency of light extracted to the light guide module 500 through the light source portion 130 may be reduced. Accordingly, the upper surface of the circuit board 110 may be disposed lower than the upper or lower surface of the light source portion 130.

The side portion 103 of the heat dissipation plate 101 may be vertically bent from each side surface of the heat dissipation portion 102, and may be disposed one or more along the outer side of the heat dissipation portion 102. An empty space 109 may be provided on the inner side of the side portion 103 and the lower portion of the heat dissipation portion 102, or a plurality of heat dissipation fins may be arranged in the empty space 109. The recess portion 108 is formed at a predetermined depth from the upper surface of the heat dissipation portion 102 of the heat dissipation plate 101, and the depth may be equal to a sum of a thickness of the circuit board 110 and a thickness of the adhesive film 155, or may be 120% or less of the thickness of the circuit board 110. For example, the upper surface of the circuit board 110 may be disposed on the same plane as the upper surface of the heat dissipation plate 101, or may be arranged higher than the upper surface of the heat dissipation plate 101, for example, 120% or less of the thickness of the circuit board 110. The top view shape of the recess portion 108 may be the same as the top view shape of the circuit board 110, and may include, for example, a polygonal shape.

The circuit board 110 may be made of a resin material or may include a metal material. The circuit period 110 may be formed of any one of a ceramic-based PCB, a metal core PCB (MCPCB), a flexible PCB (FPCB), and a resin-based PCB. The circuit board 110 may include a metal layer at the lower portion thereof, a circuit layer having a pad at the upper portion, a protective layer of an insulating material for protecting the circuit layer at the upper portion, and an insulating layer between the metal layer and the circuit layer. The circuit board 110 may be provided as an MCPCB having a metal layer at the lower portion, and may transfer heat to the heat dissipation plate 101.

Here, the circuit board 110 may be fastened to the heat dissipation portion 102 by a fastening means 119, and the fastening means 119 may include a screw that fastens the circuit board 110 to the substrate heat dissipation portion 102A, and may be one or two or more. When the circuit board 110 is tightly fixed by the fastening means 119, the adhesive film 155 can be removed, and thus the circuit board 110 can be easily separated. The pads 111 and 112 of the circuit board 110 may include first and second pads 111 and 112 that are spaced apart from each other. The first and second pads 111 and 112 may be connected to a connector 115 disposed on the upper portion of the circuit board 110 through a circuit layer of the circuit board 110. The connector 115 may receive a driving signal and power from the outside. The pads 111 and 112 and the connector 115 may be disposed on both edges of the circuit board 110, and the fastening means 119 may be arranged in a region between the pads 111 and 112 and the connector 115. The first and second pads 111 and 112 are arranged adjacent to one side of the circuit board 110, and may be selected from Ti, Ru, Rh, Ir, Mg, Zn, Al, In, Ta, Pd, Co, Ni, Si, Ge, Ag, and Au, and optional alloys thereof.

The light source portion 130 may be disposed on the heat dissipation portion 102. The light source portion 130 may be arranged adjacent to the recess portion 108 of the heat dissipation portion 102 and the pads 111 and 112. The light source portion 130 may be arranged adjacent to one side of the circuit board 110. One side of the circuit board 110 may be arranged between the first and second pads 111 and 112 and the light source portion 130. The light source portion 130 may include a support member 133 and light emitting devices 131A and 131B on the support member 133. The periphery of the light emitting devices 131A and 131B may be sealed by a resin member 132. The plurality of light emitting devices 131A and 131B may be aligned in one direction. The light emitting devices 131A and 131B may emit the same color or different colors. The light emitting devices 131A and 131B may emit white light, or emit white and yellow or blue light. The light emitting devices 131A and 131B may have the same size or different sizes.

As shown in FIG. 6, the light emitting devices 131A and 131B may include a plurality of light emitting chips 30 and 32 that emit first light, and a wavelength conversion layer 31 and 33 that converts a portion of the first light into second light and third light, respectively. The first light may be blue, the second light may be yellow, and the third light may be amber. Alternatively, the third light may be green or red. The wavelength conversion layers 31 and 33 may have different phosphors, and may include a yellow phosphor and an amber phosphor. The first light emitting device 131A includes a first light emitting chip 30 and a first wavelength conversion layer 31, and may emit white light. As another example, each wavelength conversion layer 31 and 33 may include at least one or two or more of a yellow phosphor, a green phosphor, a blue phosphor, and a red phosphor.

The first light emitting device 131A may include a first light emitting chip 30 and a first wavelength conversion layer 31. The first light emitting device 131A may emit white light. The second light emitting device 131B may include a second light emitting chip 32 and a second wavelength conversion layer 33. The second light emitting device 131B may emit amber light. The light source portion 130 may selectively emit either or both of the white and the amber light. The lower surface area of the first wavelength conversion layer 31 may be larger than the upper surface area of the first light emitting chip 30, and may be arranged at 101% or more, for example, in the range of 101% to 130%, of the upper surface area of the first light emitting chip 30. The lower surface area of the second wavelength conversion layer 33 may be larger than the upper surface area of the second light emitting chip 32, and may be arranged at 101% or more, for example, in the range of 101% to 130% of the upper surface area of the second light emitting chip 32. Accordingly, the wavelength conversion layers 31 and 33 cover the entire upper surface of each light emitting chip 30 and 32, so that the wavelength conversion efficiency may be improved.

The first and second light emitting chips 30 and 32 may be connected in parallel to each other. The plurality of light emitting chips 30 and 32 may include at least one of blue, green, or red LED chips, and may be blue LED chips, for example. The above light emitting chip 30 and 32 may include a plurality of semiconductor layers made of compound semiconductors of group II and group VI elements and/or compound semiconductors of group III and group V elements, and at least one or all of the plurality of semiconductor layers may include a compound semiconductor of a series such as AlInGaN, InGaN, AlGaN, GaN, GaAs, InGaP, AlInGaP, InP, and InGaAs.

Here, the light source portion 130 may include a support member 133 and a resin member 132. The support member 133 may include a ceramic substrate or a semiconductor substrate. The support member 133 may support the plurality of light emitting chips 30 and 32 and may include an electrode pattern 161, 162, 163 and 164 of a conductive material that is electrically connected to the plurality of light emitting chips 30 and 32. The electrode patterns 161, 162, 163, and 164 may include first to third electrode patterns 161, 162 and 163 disposed on the upper surface of the support member 133 and a fourth electrode pattern 164 which is a bottom pad disposed on the lower surface.

The first and third electrode patterns 161 and 163 may be electrically connected to the first light emitting chip 30, and the second and third electrode patterns 162 and 163 may be electrically connected to the second light emitting chip 32. The first light emitting chip 30 may be mounted on the first and third electrode patterns 161 and 163 in a flip-chip type, and the second light emitting chip 32 may be mounted on the second and third electrode patterns 162 and 163 in a flip-chip type. The third electrode pattern 163 may be disposed between the other side regions of the first and second electrode patterns 161 and 162.

The first and second electrode patterns 161 and 162 may function as anode terminals of the first and second light emitting chips 30 and 32, respectively. A first bonding pad 134 is disposed on one side region of the first electrode pattern 161, and a second bonding pad 135 is disposed on one side region of the second electrode pattern 162. The first and second bonding pads 134 and 135 may be electrically connected to the circuit board 110 through a connection member 141 and 142.

The third electrode pattern 163 may function as a cathode terminal, which is a common electrode. The fourth electrode pattern 164 on the lower surface of the support member 133 may be connected to the third electrode pattern 163 through a conductive via 29. The fourth electrode pattern 164 may be bonded to an adhesive member 138 and electrically connected to a heat dissipation plate 101. The adhesive member 138 may be an electrically conductive adhesive. An area of the fourth electrode pattern 164 may be 80% or more of an area of the lower surface of the support member 133, thereby improving electrical connection and heat dissipation efficiency. A protection device 38 for protecting the first light emitting chip 30 may be disposed on the other side of the first and third electrode patterns 161 and 163, and a protection device 39 for protecting the second light emitting chip 32 may be disposed on the other side of the second and third electrode patterns 162 and 163. The protection devices 38 and 39 may be implemented as thyristors, Zener diodes, or TVS (transient voltage suppression), and protect the light emitting chips 30 and 32 from ESD (electro static discharge).

The first and second bonding pads 134 and 135 may be exposed on the upper surface of the light source portion 130. The resin member 132 may be disposed around the upper portion of the light source portion 130. The resin member 132 surrounds the surfaces of the first to third electrode patterns 161, 162 and 163 disposed on the upper surface of the support member 133, the side surfaces of the first and second light emitting chips 30 and 32, and the side surface of the wavelength conversion layer 31 and 33. The resin member 132 may be further disposed between the first and second light emitting chips 30 and 32 and between the wavelength conversion layers 31 and 33 to block interference between lights and reduce light loss.

The resin member 132 may be a reflective material. The resin member 132 may be formed of a single layer or multiple layers of a material having silicon or epoxy. The resin member 132 has reflective properties and may include, for example, a reflective material (e.g., $SiO_2$, $TiO_2$) within the resin material. The resin member 132 or the light source portion 130 may further include a convex lens (not shown) on the upper portion.

The support member 133 may conduct heat generated from the light emitting chips 30 and 32 through the heat dissipation plate 101. The above-mentioned support member 133 can be bonded to the heat dissipation plate 101 using an adhesive member 138. The adhesive member 138 can include a thermally conductive adhesive having metal powder or inorganic powder in a resin material, such as a TIM (Thermal interface material). The adhesive member 138 can be arranged along the lower surface and a lower portion of the side surface of the support member 133. The adhesive member 138 is disposed on the outer side surface of the support member 133 and can be in contact with each side surface of the support member 133.

As shown in FIGS. 2 and 4, the first and second light emitting devices 131A and 131B are disposed on the upper portion of the other side of the support member 133, and the bonding pad 134 and 135 may be exposed on an upper portion of the one side surface of the support member 133. The bonding pads 134 and 135 may be sealed to the resin member 132 so as to be exposed on the upper surface of the resin member 132. The bonding pads 134 and 135 may be disposed closer to the first and second pads 111 and 112 than the first and second light emitting devices 131A and 131B. The bonding pads 134 and 135 may be connected to the anode terminals of the first and second light emitting devices 131A and 131B, respectively. The first and second bonding pads 134 and 135 may function as anode terminals. The first bonding pad 134 and the second bonding pad 135 may be selected from Ti, Ru, Rh, Ir, Mg, Zn, Al, In, Ta, Pd, Co, Ni, Si, Ge, Ag, Au, and optional alloys thereof.

As shown in FIG. 4, the thickness of the bonding pad 134 and 135 may be thicker than the thickness of the light emitting chip 30 and 32. The upper surface of the bonding pad 134 and 135 may be disposed on the same plane as the upper surface of the light source portion 130, or may be arranged higher than the upper surface of the light emitting chip 30 and 32. The upper surface area of the bonding pad 134 and 135 is arranged to be 30% or more, for example, in the range of 30% to 80%, of the upper surface area of each wavelength conversion layer 31 and 33, so that a bonding area of the ribbon-shaped connection member 141 and 142 increases, and the bonding strength decrease due to bonding can be prevented.

The first bonding pad 134 may be connected to the first pad 111 and the first connection member 141, and the second bonding pad 135 may be connected to the second pad 112 and the second connection member 142. The first connection member 141 and the second connection member 142 may be conductive wires with a ribbon shape, and the wires may include at least one of Au, Al, and Ag. The ribbon shape may be a shape having a width greater than a thickness of each connection member 141 and 142 and a long length. The width of each of the above connection members 141 and 142 includes an upper surface width and a lower surface width, and each of the upper surface width and the lower surface width of each of the above connection members 141 and 142 may be larger than the thickness of each of the connection members 141 and 142, and preferably, may be at least twice the thickness of each of the above connection members 141 and 142, for example, more than twice.

The width W1 of each of the first connection member 141 and the second connection member 142 is a length in a direction orthogonal to a length direction of each of the connection members 141 and 142 and may be greater than the thickness of each of the connection members 141 and 142. The width W1 of each of the first connection member 141 and the second connection member 142 may be 0.4 mm or more, for example, in a range of 0.4 mm to 0.9 mm. The thickness of each of the first connection member 141 and the second connection member 142 may be 0.15 mm or less, for example, in a range of 0.07 mm to 0.15 mm. The width W1 of each of the first connection member 141 and the second connection member 142 may be more than twice the thickness. If the width W1 of each of the first and second connection members 141 and 142 is smaller than the above range, wires such as the connection members 141 and 142 may be bent downward, and the bonding force may decrease, the allowable current may decrease, and the resistance to external force may be weakened. In addition, if the width W1 of the connection members 141 and 142 is larger than the above range, there is a problem that the size of the bonding pads 134 and 135 or pads 111 and 112 may increase or materials may be wasted. The length between one end 41 and the other end 43 of the connection members 141 and 142 may be longer than the width W1.

The light source portion 130 may be spaced apart from one side of the circuit board 110 by a predetermined distance. The distance between the light source portion 130 and one side of the circuit board 110 may improve the heat dissipation efficiency of the heat dissipation portion 102 located below the light source portion 130, but may cause an increase in the length of the connection member 141 and 142. The distance between the light source portion 130 and the circuit board 110 may be 0.5 times or more, for example, 0.5 to 2 times the length of one side of the light source portion 130. The length of one side of the light source portion 130 may be 2 mm or more, or 3 to 4 mm. Accordingly, the connection member 141 and 142 may be provided in a ribbon shape to prevent wire sagging, and improve the heat dissipation efficiency of the light source portion 130. The length of one side of the first and second bonding pads 134 and 135 may be 0.7 mm or more, for example, in the range of 0.7 mm to 1 mm. The width and length of the first and second pads 111 and 112 may be arranged in the range of 80% to 200% of the length of the first and second bonding pads 134 and 135, respectively. Since the length in one direction of the first and second bonding pads 134 and 135 and the first and second pads 111 and 112 is provided to be 1.5 times or more, for example, in the range of 1.5 to 4 times the width W1 of the connection member 141 and 142, bonding failure of the connection member 141 and 142 can be prevented.

The first connection member 141 and the second connection member 142 have one end 41 bonded to the first bonding pad 134 and the second bonding pad 135, respectively, and the other end 43 bonded to the first pad 111 and the second pad 112, respectively. The first connection member 141 and the second connection member 142 include a center portion 42 extending from one end 41 toward the other end 43, and the center portion 42 may extend from the other side surface of the light source portion 130 to one side of the circuit board 110. The center portion 42 may extend onto a recess portion 108 between the circuit board 110 and the heat dissipation portion 102. The center portion 42 may be an intermediate wire located between one end 41 and the other end 43 of each connection member 141 and 142. The center portion 42 may have a convex shape between the one end 41 and the other end 43.

The width of the center portion 42 may be less than or equal to the width of the one end 41 and the other end 43 to be bonded. The height of the one end 41 of the first connection member 141 and the second connection member 142 may be arranged higher than the height of the other end 43, and the high point height of the center portion 42 may be arranged higher than that of the one end 41. After the one end 41 or the other end 43 of the above connection member 141 and 142 is bonded, the bonding force or open failure is measured, and when a wire pull off test is performed, there is a problem that an open failure occurs due to a crack (e.g., heel crack) at one end 41 or the other end 43 rather than an open at the center portion 42.

In order to prevent the opening failure of the connection member 141 and 142, the minimum straight distance D1 between the one end 41 and the other end 43 perpendicular to the straight line, the vertical height H1 from the other end 43 to the center portion 42, and a first extension angle R1 of the center portion 42 extended from one end 41 and a second extension angle R2 of the center portion 43 extended to the other end 43 may satisfy the following relationships.

$$H1 < D1. \quad \text{(Formula 1)}$$

$$R2 \le R1 \quad \text{(Formula 2)}$$

D1 is 1.1 times or more of H1, for example, in a range of 1.1 to 2 times, and may be in the range of 3 mm to 10 mm, and H1 may be 5 mm or less, for example, in a range of 0.4 to 5 mm. The extension angles R1 and R2 may be the same as each other or have a difference of 15 degrees or less. Here, when the H1 increases, the angles R1 and R2 increase proportionally, and the force for pulling the wire may also increase, but if the range is exceeded, a heel crack or a bound crack may occur as in FIG. 5(B). Accordingly, the first and second extension angles R1 and R2 may be 45 degrees or less, for example, in a range of 15 to 45 degrees or 20 to 30 degrees. Here, the first extension angle R1 is an angle between a straight line horizontal to one end 41 and a tangent line K1 passing through one region of the center portion 42 adjacent to the one end 41, and the second extension angle R2 is an angle between a straight line horizontal to the other end 43 and a straight line K2 passing through the high point of the center portion 42. By setting the angles R1 and R2 extending from the center portion 42 to the one end 41 and the other end 43 within the above range, it is possible to prevent open defects due to cracks, i.e., heel cracks or bound cracks, at the bonding portion of the connection members 141 and 142.

Second Embodiment

FIG. 7 is a perspective view of a lighting device according to the second embodiment, FIG. 8 is another example of the lighting device of FIG. 7, FIG. 9(A)(B) is front and rear views showing light emitting chips of the light source portion of FIG. 7, and FIG. 10(A)(B) is front and rear views showing light emitting chips of the light source portion of FIG. 7. The second embodiment can be applied to the lighting device of the first embodiment, a modification of the first embodiment, or other examples of FIGS. 19 to 20 described below. In the description of the second embodiment, the description of the first embodiment will be referred to for the same configuration as the first embodiment.

Referring to FIGS. 7 to 10, the lighting device may include a heat dissipation plate 101 and a light source portion 130A disposed on a circuit board 110. The light source portion 130A may be connected to the heat dissipation plate 101 and the circuit board 110 in a flip type. The light source portion 130A may emit white light or emit at least two colors, for example, white and amber light.

The light source portion 130A may include a first light emitting device 131A. As shown in FIG. 9, the first light emitting device 131A may include a plurality of light emitting chips 35 and a wavelength conversion layer 36 covering the plurality of light emitting chips 35. The first light emitting device 131A may emit white light. The plurality of light emitting chips 35 may be arranged in one direction, and the wavelength conversion layer 36 may be extended in one direction. The plurality of light emitting chips 35 may include first and second electrode patterns 165 and 166 and a third electrode pattern 167 and 168 of a sub. The plurality of light emitting chips 35 may be connected in series between the first electrode pattern 165, the third electrode pattern 167 and 168 and the second electrode pattern 166. A protection device 38A may be connected between the first and second electrode patterns 165 and 166 to protect the light emitting chips 35.

The first electrode pattern 165 may be connected to a fourth electrode pattern 164A, which is an anode terminal, through a via 29A, and the fourth electrode pattern 164A may be bonded and connected to a pad 113, 113A and 113B of a circuit board 110 by a conductive second adhesive member 139. Here, on the circuit board 110, the pad may be arranged as a single pad 113 or multiple pads 113A and 113B. The second electrode pattern 166 may be connected to a fifth electrode pattern 164B, which is a cathode terminal, through a via 29B, and the fifth electrode pattern 164B may be electrically connected to a heat dissipation plate 101 through a first conductive adhesive member 138. The fifth electrode pattern 164B may have an area at least twice that of the fourth electrode pattern 164A, thereby increasing heat dissipation efficiency through the heat dissipation plate 101. The number of vias 29A connected to the first electrode pattern 165 may be at least twice that of the number of vias 29B connected to the second electrode pattern 166. The above fourth and fifth electrode patterns 164A and 164B may be the first and second bonding pads at the lower portion. Here, the first light emitting device 131A may be disposed in a region that does not vertically overlap with the circuit board 110 for heat dissipation, and for example, may be disposed to vertically overlap with the heat dissipation plate 101.

As shown in FIG. 10, the first light emitting device 131A may have four or five or more light emitting chips 35 connected in series, and may be arranged in at least two rows. The wavelength conversion layer 36 is disposed on the light emitting chips 35 to convert the wavelength, and the light source portion may emit white light.

The light source portion 130 and 130A according to the first and second embodiments of the invention may be connected to the circuit board 110 on the heat dissipation plate 101 by a connection member 141 and 142, or may be mounted in a flip type. This light source portion 130 and 130A may be extracted through a light guide module 500 made of a transparent material, as shown in FIG. 11.

Referring to FIGS. 11 to 18, the light guide module 500 includes a support member 510 and a light guide portion 520. The support member 510 may be made of a transparent plastic material, and the light guide portion 520 may protrude on the support member 510 and may be made of a transparent plastic material. The transparent plastic material may include PC or PMMA. The support member 510 and the light guide portion 520 may be made of the same material. The support member 510 and the light guide portion 520 may be formed integrally with a transparent material. The support member 510 may be coupled to a heat dissipation plate 101 so as to align a position between the light source member 130 and 130A and the light guide portion 520. In addition, the support member 510 can cover the upper periphery of the light source member 130 and 130A so that the light emitted from the light source member 130 and 130A may be effectively incident.

As shown in FIG. 11, FIG. 15, and FIG. 16, the lower surface or upper surface of the support member 510 may be arranged parallel to the upper surface of the heat dissipation plate 101. The support member 510 may be disposed apart from the upper surface of the heat dissipation plate 101 by a predetermined distance G1. The distance G1 may be a position higher than the high point height of the connection member 141 and 142 of the light source member 130 of FIG. 1, and may be, for example, 2.5 mm or more, for example, in the range of 2.5 mm to 7 mm. If the above distance G1 is smaller than the above range, it may affect the connection member 141 and 142, and if it is larger than the above range, the brightness may be reduced. If the light source portion 130A of FIG. 7 is arranged, the distance G1 may be smaller, and may be in the range of, for example, 1.5 mm to 5 mm.

The light guide portion 520 is provided in a pillar shape, and may include, for example, a circular pillar or a polygonal pillar shape. The light guide portion 520 may have a shape with a narrow lower area and a wide upper area depending on the directional distribution of the light source portion 130 and 130A. The directional angle of the light source portion 130 and 130A may be 70 degrees or more, for example, in the range of 70 degrees to 150 degrees. The light guide portion 520 may overlap the light source portion 130 and 130A in a vertical direction. The light guide portion 520 causes the point light of the light source portion 130 and 130A to be emitted as surface light. The light guide portion 520 may have a larger upper surface area than the upper surface area of the light source portion 130 and 130A. The diameter of the light guide portion 520 may be larger than the length of one side of the light source portion 130 and 130A, for example, 1.5 times or more the length of one side of the light source portion 130 and 130A, and preferably, 5 mm or more, for example, in the range of 5 mm to 10 mm. When the diameter of the light guide portion 520 is smaller than the above range, the amount of incident light may be reduced, and when it is larger than the above range, the luminous intensity or luminous intensity distribution may be degraded. The support member 510 includes a first support protrusion 531 and a second support protrusion 535 at the lower portion thereof, and the first support protrusion 531 may be disposed on both sides of the outer lower portion of the support member 510, and the second support protrusion 535 may be disposed on both sides of the inner lower portion. Here, the inner portion may be in the direction of the circuit board 110 arranged at the center of the heat dissipation plate 101. The support member 510 may be coupled with the heat dissipation plate 101. The first coupling hole 105 and the second coupling hole 106 of the heat dissipation plate 101 may be respectively disposed on both outer sides of the light source portion 130, and may face the first and second support protrusions 531 and 535.

As shown in FIGS. 13, 14, and 17, the first support protrusion 531 is mounted on the upper surface of the heat dissipation plate 101. At this time, the insertion protrusion 531A of the first support protrusion 531 has a diameter smaller than the diameter of the first support protrusion 531 at the lower portion, and may penetrate through the first coupling hole 105. As shown in FIGS. 13, 14, and 18, the second support protrusion 535 has a diameter larger than the second coupling hole 106, faces the second coupling hole 106, and may be mounted on the heat dissipation plate 101. The second support protrusion 535 has a fastening hole 535B therein, and can fasten the heat dissipation plate 101 and the support member 510 through a fastening member 590. On the upper surface of the support member 510, a step portion 535A for fixing the end of the fastening member 590 may be arranged, or a washer or nut may be combined.

FIGS. 19 to 30 are drawings showing other examples of the first embodiment. FIG. 19 is a partial enlarged view of a lighting device of another example of FIG. 2 of the invention, FIG. 20 is a partial plan view of the lighting device of FIG. 19, and FIG. 21 is a side cross-sectional view of the lighting device of FIG. 19. In the description of other examples, the same configuration as the first embodiment will be referred to the description of the first embodiment, and can be applied to the second embodiment.

Referring to FIGS. 19 to 22, the lighting device 1000 may include a heat dissipation plate 101, a circuit board 110 disposed on the heat dissipation plate 101, a light source portion 130 disposed on the heat dissipation plate 101 and having a light emitting device 131, a connection member 145 and 146 connecting the light source portion 130 and the circuit board 110, and an adhesive member 138 that adheres the light source portion 130 to the heat dissipation plate 101. The heat dissipation plate 101 and the circuit board 110 will be described with reference to the description of the first embodiment. The above heat dissipation plate 101 includes a heat dissipation portion 102 and a side portion 103, and the heat dissipation portion 102 may be provided with an area larger than an area of the circuit board 110, for example, two or more times or more. The side portion 103 may be bent backward from an edge of the heat dissipation portion 102, and may be disposed one or more times along the outer side of the heat dissipation portion 102. An empty space 109 may be provided on the inner side of the side portion 103 and the lower side of the heat dissipation portion 102, or a structure such as another heat dissipation fin may be combined. The heat dissipation plate 101 may include a concave portion (not shown) in which the circuit board 110 is mounted, and the height of the upper surface of the circuit board 110 may be lowered by the depth of the concave portion. On both sides of the heat dissipation portion 102, coupling holes 105 and 106 are respectively arranged so that the unit can be fastened to an external structure having a light guide portion. The coupling holes 105 and 106 can be disposed on both sides of the light source portion 130.

The circuit board 110 is disposed on the heat dissipation plate 101 and may be adhered to the heat dissipation plate 101 with an adhesive member 138. The adhesive member 138 includes a heat-conductive adhesive member and may be an electrically insulating material such as silicone or epoxy. The upper surface of the circuit board 110 may be disposed on the same plane as the upper surface of the heat dissipation plate 101 or may be disposed lower than the upper surface of the heat dissipation plate 101. The adhesive member 138 may adhere the circuit board 110 to the heat dissipation portion 102.

The adhesive member 138 may be disposed on the lower surface of the light source portion 130, may protrude outward from the side surfaces of the light source portion 130, and may be bonded to the lower side surface of the light source portion 130. The adhesive member 138 may be in contact with the inner surface of the circuit board 110. The inner side surface of the circuit board 110 may include surfaces facing at least three side surfaces of the light source portion 130. Here, the circuit board 110 may be fastened to the heat dissipation portion 102 by a fastening means 119, and the fastening means 119 may include one or more screws that fasten and adhere the circuit board 110 to the heat dissipation portion 102. The fastening means 119 may include a fastening structure and/or a hanging structure as another example. The adhesive film 155 may adhere the circuit board 110 to the heat dissipation portion 102 and may be a thermally conductive tape. When the circuit board 110 is fixed by the above fastening means 119, the adhesive film 155 can be removed, and thus, the circuit board 110 can be easily separated.

The pads 111 and 112 of the circuit board 110 may include first and second pads 111 and 112 that are spaced apart from each other. The first and second pads 111 and 112 can be connected to a connector 115 disposed on the upper portion of the circuit board 110 through the circuit layer of the circuit board 110. The circuit board 110 has a protective layer 110B on the metal layer 110A, and the protective layer 110B may protect the surface of the pads 111 and 112 and the circuit layer, and can open the bonding regions of the pads 111 and 112. The protective layer 110B may be an insulating material, such as a solder resist material, that partially exposes the pads 111 and 112.

As shown in FIG. 20, the first pad 111 may include first and second regions B1 and B2 corresponding to two different side surfaces of the first bonding pad 134. The first and second regions B1 and B2 may be disposed on the outer side of two different side surfaces of the recess portion 108 or on the outer side of two different side surfaces of the other side of the light source portion 130. The first and second regions B1 and B2 may have a shape that is bent in a direction orthogonal to each other. For example, the first pad 111 may be disposed on the other side and the first outer side of the first bonding pad 134, and the second pad 112 may be disposed on the other side and the second outer side of the second bonding pad 135. The other sides of the first and second bonding pads 134 and 135 may be regions extending in the first direction from the first and second pads 111 and 112, and the first and second outer sides may be opposite sides of the light source portion 130 and the recess portion 108 in the second direction. The second pad 112 may include third and fourth regions B3 and B4 corresponding to two different side surfaces of the second bonding pad 135. The third and fourth regions B3 and B4 may be disposed on the outer sides of two different side surfaces of the recess portion 108, or may be disposed on the outer sides of two different side surfaces of the other side of the light source portion 130. The third and fourth regions B3 and B4 may have shapes that are bent in directions that are orthogonal to each other.

The circuit board 110 may include a concave recess portion 108 from one side surface of the circuit board 110. The bottom area of the recess portion 108 may be less than or equal to the lower surface area of the light source portion 130, for example, less than or equal to 50% of the lower surface area of the light source portion 130, and may be, for example, in the range of 10% to 50% or 10% to 40% of the lower surface area of the light source portion 130. When the bottom area of the recess portion 108 is within the above range, the bonding efficiency between the light source portion 130 and the circuit board 110 can be improved, and the size or area of the member 145 and 146 connecting the light source portion 130 and the circuit board 110 can be optimized. When the area of the recess portion 108 is larger than the above range, there is a problem that the area or size of the member 145 and 146 connecting the circuit board 110 and the light source portion 130 increases. When the area of the recess portion 108 is smaller than the above range, the insertion of the light source portion 130 may be difficult, or the size or area of the member connecting the light source portion 130 and the circuit board 110 may be reduced, which may result in a decrease in electrical reliability.

The recess portion 108 has a concave shape from one side of the circuit board 110 to the other side, and may have a polygonal shape in the top view. The depth D2 of the recess portion 108 may be 30% or more of the length D0 of the light source portion 130 in the first direction, and may be, for example, in the range of 30% to 50% of the length D0. The depth D2 of the recess portion 108 may be a depth at which at least a part or all of the first and second bonding pads 134 and 135 are located within the region of the recess portion 108.

As another example, as shown in FIG. 29, the depth D3 of the recess portion 108 may be a depth at which the entire light source portion 130 is inserted. After at least a part of the light source portion 130 is inserted into the inside of the recess part 108, it is adhered with an adhesive member 138, so that at least an inner edge part of the light source portion 130 and an inner surface of the circuit board 110 can be adhered with the adhesive member 138. Accordingly, the adhesion force for the light source portion 130 can be increased, and for example, the adhesion force can be 5 kgf or more.

The light source portion 130 may be disposed on the heat dissipation portion 102. At least a portion of the light source portion 130 may be disposed on the heat dissipation portion 102 and within the recess part 108. The light source portion 130 may be disposed inside one side surface of the circuit board 110. One side surface of the circuit board 110 may be arranged outside the first and second pads 111 and 112 and outside the other side surface of the light source portion 130.

As shown in FIG. 21, the light source portion 130 may include a support member 133 and at least one light emitting device 131, for example, one or more light emitting devices, on the support member 133. The light emitting device 131 may be sealed by a resin member 132. The support member 133 may include a ceramic substrate or a semiconductor substrate. The support member 133 may support the light emitting device 131 and may include a conductive pattern that may electrically connect the light emitting device 131. That is, the light source portion 130 may be provided with a light emitting device 131 on one side and a bonding pad 134 and 135 on the other side.

The pads 134 and 135 of the light source portion 130 may be arranged within the recess portion 108, and the light emitting device 131 may be disposed on the outside of the recess portion 108. At least a portion of the connection member 145 and 146 may be disposed on the recess portion 108. A protection device (not shown) for protecting the light emitting devices 131 may be disposed on the support member 133, and the protection device may be implemented as a thyristor, a Zener diode, or a TVS (Transient voltage suppression), and protects the light emitting devices 131 from ESD (electro static discharge).

The support member 133 may be formed of a ceramic material or an MCPCB material. The support member 133 may conduct heat generated from the light emitting devices 131 through the heat dissipation plate 101. The support member 133 may be adhered to the heat dissipation plate 101 using an adhesive member 138. The adhesive member 138 may include a thermally conductive adhesive member having metal powder or inorganic powder in a resin material, such as a TIM (Thermal interface material). The adhesive member 138 may be arranged along the lower surface and the lower side of the side surface of the support member 133. The adhesive member 138 may be disposed at the outer side of the side surface of the support member 133 and may be in contact with each side surface of the support member 133.

The light emitting device 131 may include at least one of a blue, green, or red LED chip. The light emitting device 131 may be bonded with a flip chip. The resin member 132 may be formed of a single layer or multiple layers of a material having silicon or epoxy. The resin member 132 may further include a convex lens (not shown) on the upper portion. The light emitting device 131 may include a light emitting chip 30 disposed on the support member 133 and a wavelength conversion layer 31 disposed on the light emitting chip 30.

The wavelength conversion layer 31 is disposed on the light emitting chip 30 and may cover the entire upper surface of the light emitting chip 30. The wavelength conversion layer 31 converts some of the light emitted from the light emitting chip 30. The wavelength conversion layer 31 may be in contact with the upper surface of the light emitting chip 30 and a portion of the resin member 132. The above wavelength conversion layer 31 may include at least one or two or more of a yellow phosphor, a green phosphor, a blue phosphor, and a red phosphor.

As shown in FIGS. 19 to 21, the light emitting device 131 is disposed on the upper portion of one side of the support member 133, and a bonding pad 134 and 135 may be exposed on the upper portion of the other side of the support member 133. The bonding pad 134 and 135 may include a first bonding pad 134 connected to the cathode of the light emitting device 131, and a second bonding pad 135 connected to the anodes of the plurality of light emitting devices 131. The first bonding pad 134 may function as a cathode terminal, and the second bonding pad 135 may function as an anode terminal.

The first bonding pad 134 may be connected to the first pad 111 and the first connection member 145, and the second bonding pad 135 may be connected to the second pad 112 and the second connection member 146. The first connection member 145 and the second connection member 146 may include an electrically conductive material, and may include, for example, an adhesive material (TIM: Terminal interface materials) of an electrically conductive material or an electrically conductive paste. The adhesive material of the electrically conductive material may be provided as an electrically conductive material by adding a metal material to the inside of silicone or epoxy. The adhesive material of the electrically conductive material may include a transparent conductive film or an opaque conductive film. The viscosity coefficient of the material of the first and second connection members 145 and 146 may have a viscosity coefficient of 100,000 cP or more.

The first connection member 145 may be brought into contact with the surface of the first pad 111 from the surface of the first bonding pad 134 and may extend along the upper surface of the light source portion 130 and the upper surface of the circuit board 110. The other end of the first connection member 145 may be connected to the first region B1 of the first pad 111 or may be connected to the second region B2. The second connection member 146 may be brought into contact with the surface of the second pad 112 from the surface of the second bonding pad 135 and may extend along the upper surface of the light source portion 130 and the upper surface of the circuit board 110. The other end of the second connection member 146 may be connected to the third region B3 of the second pad 112 or may be connected to the fourth region B4. The regions where the other ends of the first and second connection members 145 and 146 are located may be selected in various ways, so that the length and contact may of the first and second connection members 145 and 146 can be optimized. In addition, the sizes and shapes of the first and second bonding pads 134 and 135 can be changed in various ways.

The first connection member 145 and the second connection member 146 can be extended through the recess portion 108 between the light source portion 130 and the circuit board 110. The width or thickness of each of the first connection member 145 and the second connection member 146 may be smaller than the length extended in one direction. The width of each of the first connection member 145 and the second connection member 146 may be larger than the thickness of the first and second connection members 145 and 146. Preferably, the width of each of the first and second connection members 145 and 146 may be at least twice, for example, more than twice, the thickness of each of the first and second connection members 145 and 146. Here, the thickness of each of the first and second connection members 145 and 146 may be the maximum thickness in the vertical direction at one end 51 or/and the other end 52 of each of the connection members 145 and 146. The width of each of the first and second connection members 145 and 146 may be the lower surface width or the maximum width at one end 51 or/and the other end 52 of each of the connection members 145 and 146.

Each of the first connection member 145 and the second connection member 146 may include a straight shape, a curved shape, or an angular shape. The extended shapes of the first connection member 145 and the second connection member 146 may be arranged parallel to each other, disposed on the same straight line, or arranged not parallel to each other. Here, when the upper surface height H2 of the circuit board 110 is arranged higher than the upper surface height of the light source portion 130, the surfaces of the first and second connection members 145 and 146 may have a stepped or curved shape depending on the difference in the upper surface heights of the circuit board 110 and the light source portion 130.

The first connection member 145 and the second connection member 146 have one end 51 bonded to the first bonding pad 134 and the second bonding pad 135, respectively, and the other end 52 bonded to the first pad 111 and the second pad 112, respectively. The first connection member 145 and the second connection member 146 include a center portion 53 extending from one end 51 to the other end 52, and the center portion 53 may extend from the other side surface of the light source portion 130 to the inside of the circuit board 110 through the region of the recess portion 108. A portion 53A of the center portion 53 may protrude into the recess portion 108 between the circuit board 110 and the heat dissipation portion 102. The height of one end 51 of the first connection member 145 and the second connection member 146 may be disposed to be equal to or lower than the height of the other end 52, and the height of the center portion 53 may be a height between the heights of the one end 51 and the other end 52 or the same height. The width of the center portion 53 may be less than or equal to the width of the one end 51 and the other end 52. The width of the center portion 53 may be the width of the center-side bottom surface of each connection member 145 and 146. The width of the one end 51 and the other end 52 may be the width of the bonded portion or the width of the bottom surface. The length of each connection member 145 and 146 may be greater than the width of each connection member 145 and 146.

The gap G2 between the light source portion 130 and the circuit board 110 may be a portion of the recess portion 108 and may be 0.4 mm or more, for example, in the range of 0.4 mm to 0.6 mm. If the range of the gap G2 is smaller than the above range, the buffer space due to the difference in thermal expansion between the light source portion 130 and the circuit board 110 is reduced, and thus, when the light source portion 130 moves, the electrical reliability of the first and second connection members 145 and 146 may be reduced. If the gap G2 between the light source portion 130 and the circuit board 110 is larger than the above range, the length or material of the first and second connection members 145 and 146 increases.

A portion 138A of the adhesive member 138 may be positioned in the gap G2 between the light source portion 130 and the circuit board 110. The portion 138A of the adhesive member 138 may overlap the first and second connection members 145 and 146 in the vertical direction. The portion 138A of the adhesive member 138 may face or come into contact with a portion 53A of the first and second connection members 145 and 146. The portion 138A of the adhesive member 138 may protrude to a height of 0.4 mm or more, for example, in the range of 0.4 mm to 0.6 mm, based on the bottom of the light source portion 130, and contact between the light source portion 130 and the circuit board 110 may be prevented by this height.

As shown in FIG. 22, when the adhesive member 138 or the circuit board 110 expands or contracts due to heat generated, cracks may occur in the first and second connection members 145 and 146. To this end, a resin portion 149 may be further disposed in the gap of the recess portion 108 between the light source portion 130 and the circuit board 110, so that the resin portion 149 may alleviate thermal deformation of the adhesive member 138 transmitted in the vertical direction. In addition, the resin portion 149 may alleviate thermal deformation of the circuit board 110 transmitted in the horizontal direction. The height of the resin portion 149 may be 10% or more of the length between the lower surface and the upper surface of the light source portion 130, for example, 10% to 50% or 10% to 100%, if it is smaller than the above range, the effect of suppressing thermal deformation may be reduced, and if it is larger than the above range, the adhesive strength of the light source portion 130 may be reduced. By lowering the height of the connection member 145 and 146 connecting the light source portion 130 and the circuit board 110 lower than the height of the wire, interference or reflection of light emitted from the light emitting device 131 may be reduced. In addition, by inserting at least a part of the light source portion 130 into the recess portion 108 of the circuit board 110 and then attaching it, the movement of the light source portion 130 can be suppressed, and the size of the lighting module having the light source portion 130 and the circuit board 110 can be reduced.

As shown in FIG. 23, the light source portion 130 can include first and second light emitting devices 131A and 131B, and the first and second light emitting devices 131A and 131B have a structure in which different wavelength conversion layers are disposed on the light emitting chip 30 disclosed above. The different wavelength conversion layers can emit light of a wavelength different from the light-emitting wavelength of the light emitting chip 30, for example, a green wavelength and a red wavelength. The light emitting chip 30 can emit light of a blue wavelength.

As shown in FIG. 24, the heat dissipation plate 101 includes a heat dissipation portion 102 having a protrusion portion 102B, and the protrusion portion 102B may be disposed at the lower portion of the light source portion 130. Due to the protrusion portion 102B, a height of the upper surface of the light source portion 130 may be the same as a height of the upper surface of the circuit board 110, or may be positioned in the range of 80% to 120% of the height of the upper surface of the circuit board 110. Accordingly, the first and second connection members 145 and 146 may connect between the bonding pads 134 and 135 and the pads 111 and 112 without a step structure or a curved shape on the surface.

As shown in FIG. 25, the first connection member 145 may connect the first bonding pad 134 and a second region B2 of the first pad 111, and the second connection member 146 may connect the second bonding pad 135 and a fourth region B4 of the second pad 112. As another example, the first connection member 145 may connect the first bonding pad 134 and the first region B1 of the first pad 111, and the second connection member 146 may connect the second bonding pad 135 and the fourth region B4 of the second pad 112. As another example, the first connection member 145 may connect the first bonding pad 134 and the second region B2 of the first pad 111, and the second connection member 146 may connect the second bonding pad 135 and the third region B3 of the second pad 112.

As described above, the first and second connection members 145 and 146 may be arranged in a straight bar shape or a curved bar shape. As another example, the first connection member 145 may be bonded to both the first and second regions B1 and B2 of the first pad 111, and the second connection member 146 may be bonded to both the third and fourth regions B3 and B4 of the second pad 112.

As shown in FIG. 26, the first connection member 145 has a circular shape with a predetermined diameter, is disposed on the first bonding pad 134 and the first pad 111, and can connect the first bonding pad 134 and the first pad 111. The first connection member 145 has a circular shape with a predetermined diameter, is disposed on the first bonding pad 134 and the first pad 111, and can connect the first bonding pad 134 and the first pad 111. One or more of the first and second connection members 145 and 146 may be arranged in a circular or elliptical shape. The plurality of circular or elliptical shapes can be connected to each other.

As shown in FIG. 27 and FIG. 28, the lighting device may include a first connection frame 151 and a second connection frame 152 disposed on the light source portion 130 and the circuit board 110. The first connection frame 151 has a length longer than the minimum gap between the first bonding pad 134 and the first pad 111 and may connect the first bonding pad 134 and the first pad 111. The first connection frame 151 may be disposed on the first pad 111 and the first bonding pad 134, and the second connection frame 152 may be disposed on the second pad 112 and the second bonding pad 135. The first connection frame 151 and the first bonding pad 134 may be bonded with a first bonding member 145A, and the first connection frame 151 and the first pad 111 may be bonded with a second bonding member 145B. The second connection frame 152 and the second bonding pad 135 may be bonded with a third bonding member 146A, and the second connection frame 152 and the first pad 111 may be bonded with a fourth bonding member 146B. The first and second connection frames 151 and 152 may be frames made of a metal material, and may include at least one of copper, gold, silver, aluminum, or nickel. The first to fourth bonding members 145A, 145B, 146A and 146B may be a conductive bonding material, for example, a solder paste material.

The first connection frame 151 has a plurality of first through holes TH1, and the plurality of first through holes TH1 may overlap the first bonding pad 134 and the first pad 111 in a vertical direction. The first bonding member 145A and the second bonding member 145B may be filled or protruded through the plurality of first through holes TH1. Accordingly, the first and second bonding members 145A and 145B may be protruded through the first through holes TH1 or filled inside, so that the bonding strength between the first connection frame 151 and the first and second bonding members 145A and 145B may be improved.

The second connection frame 152 has a length longer than the minimum distance between the second bonding pad 135 and the second pad 112, and may connect the second bonding pad 135 and the second pad 112. The first connection frame 151 may extend in a straight line from the first pad 111 toward the first bonding pad 134, and the second connection frame 152 may extend in a straight line from the second pad 112 toward the second bonding pad 135.

The second connection frame 152 has a plurality of second through holes TH2, and the plurality of second through holes TH2 may overlap the second bonding pad 135 and the second pad 112 in a vertical direction. The third bonding member 146A and the fourth bonding member 146B may be filled or protruded through the plurality of second through holes TH2. Accordingly, the third and fourth bonding members 146A and 146B may be protruded through the second through holes TH2 or filled inside, so that the bonding strength between the second connection frame 152 and the third and fourth bonding members 146A and 146B may be improved.

As shown in FIG. 29, a depth D3 of the recess portion 108 of the circuit board 110 may be greater than the length of the light source portion 130 in one direction. That is, since the light source portion 130 is embedded in the recess portion 108, at least three side surfaces of the light source portion 130 may be adhered to the circuit board 110 and the bottom of the recess portion 108 by the adhesive member 138.

As shown in FIG. 30, the light emitting device 131 of the light source portion 130 may have a width in the first direction smaller than the length in the second direction, and a part of the first direction (i.e., the center region) may extend to the region between the first and second bonding pads 134 and 135. In this case, the second direction length of the light source portion 130 can be arranged to be equal to or longer than the first direction length. That is, in order to increase the upper surface area of the light emitting device 131, a portion of the region thereof is added to the region between the first and second bonding pads 134 and 135. In this case, the wavelength conversion layer may have a shape corresponding to the light emitting device 131 or may be separated into a plurality of regions to emit red, red, and blue light, respectively, and the light emitting chip may emit ultraviolet light.

Referring to FIG. 31, a vehicle headlamp 90 having a lighting device according to an embodiment includes a light source module and a housing 92, and the light source module is disposed inside the housing 92 to radiate light in a lateral direction, and the radiated light may be reflected in an emission direction through the inner surface 92A of the housing 92. The light source module may include a lighting device according to the first embodiment disclosed above or another example, and the light guide portion 520 of the light guide module may protrude.

The housing 92 may include a metal or non-metal material, and the non-metal material may include a plastic material. The housing 92 may be a reflector of a head lamp. The inner surface 92A of the housing 92 may be a surface coated with a highly reflective material, or may include a reflective layer having an anti-reflection (AR) material. For example, the highly reflective material may include at least one of metals, such as Al, Ag, and Au, and the anti-reflection material may include at least one of $MgF_2$, $Al_2O_3$, SiO, $SiO_2$, $TiO_2+ZrO_2$, $TiO_2$, and $ZrO_2$. The reflective layer of the inner surface 92A may be a single layer or a multilayer.

The headlamp 90 may include an inner lens or/and an outer lens that projects light emitted through the housing 92. The light distribution pattern of light irradiated from the light source module may be controlled according to the shape of the inner lens or the number of light source portions. The light source module selectively irradiates light of a high beam distribution pattern and a low beam distribution pattern, and the high beam distribution pattern or the low beam distribution pattern can be automatically turned on and off according to a driving mode or a driving situation. The inner surface 92A of the housing 92 may include a partial dome shape or a partial elliptical paraboloid. The inner surface 92A may have a plurality of facets. The facets can be free-shaped, flat, and/or curved (e.g., concave or convex) members. In some examples, a single facet can have a free-shaped portion, and/or a flat portion, and/or a curved portion (e.g., any combination thereof). In some embodiments, the facet (or at least the inwardly facing surface on the facet) can be at least approximated, or otherwise defined by an algebraic equation. For example, the shape or inwardly facing surface of the facet can be described by one or more fifth-order algebraic equations (although other equations of any order are also possible). In at least one exemplary embodiment, the surface (or, for example, the coating) of the facet has a high reflectivity (e.g., greater than 80% reflectivity). Non-limiting examples of the facet and/or coating on the facet include aluminum and silver, although other reflective materials may be used.

The inner surface 92A of the housing 92 is spaced laterally from the light source module, and light emitted from the light source module may be reflected by the inner surface 92A and focused toward the exit side of the housing 92, and can be irradiated with a high beam or a low beam. The exterior of the housing 92 may include various features and accessories for mounting or connecting the headlamp 90 to the interior of the vehicle, and may have an electrical interface, such as a socket, for connecting power and/or signals. The housing 92 and cavity described above are examples and may be changed into various shapes. The housing 92 according to an embodiment may function as a reflector for the left/right headlamps 90.

The invention claimed is:

1. A lighting device comprising:
a heat dissipation plate having an upper surface and a concave recess portion from the upper surface;
a circuit board accommodated in the recess portion of the heat dissipation plate and having a plurality of pads;
a light source portion disposed on the heat dissipation plate adjacent to the circuit board and having a plurality of bonding pads;
a plurality of connection members connecting the plurality of pads and the plurality of bonding pads respectively; and
an adhesive member adheres the light source portion to the heat dissipation plate,
wherein the light source portion includes a support member; a plurality of light emitting devices having a plurality of light emitting chips on the support member and a plurality of wavelength conversion layers on each of the plurality of light emitting chips; and a resin member covering a periphery of the plurality of light emitting devices,
wherein the plurality of bonding pads has a thickness thicker than a thickness of the light emitting chip and are sealed to the resin member so as to be exposed on an upper surface of the resin member,
wherein the plurality of bonding pads has a thickness thicker than a thickness of the light emitting chip and are sealed to the resin member so as to be exposed on an upper surface of the resin member,
wherein the resin member is disposed between the plurality of light emitting chips and the plurality of wavelength conversion layers,
wherein each of the plurality of connection members has a ribbon shape,
wherein a width of each of the plurality of connection members is more than twice a thickness of the connection member, and
wherein each of the plurality of connection members includes one end bonded to each of the plurality of bonding pads, the other end connected to each of the plurality of pads, and a center portion convexly extended from the one end toward the other end.

2. The lighting device of claim 1,
wherein a length between the one end and the other end of each of the plurality of connection members is greater than the width of each of the connection members,
wherein the width of each of the plurality of connection members is in a range of 0.4 mm to 0.9 mm,
wherein a length of one side of each of the plurality of bonding pads is in a range of 1.5 to 4 times the width.

3. The lighting device of claim 1,
wherein an upper surface of the circuit board is disposed lower than an upper surface of the plurality of light emitting chips,
wherein a high point height of each of the plurality of connection members is smaller than a straight distance between the one end and the other end of each connection member.

4. The lighting device of claim 1,
wherein the support member includes an upper electrode pattern on which the plurality of light emitting chips is disposed; and a lower electrode pattern electrically connected to a portion of the upper electrode patterns and the heat dissipation plate,
wherein the resin member surrounds a surface of the upper electrode pattern disposed on an upper surface of the support member, side surfaces of the plurality of light emitting chips, and side surfaces of the plurality of wavelength conversion layers.

5. The lighting device of claim 1,
wherein the adhesive member comprises a first adhesive member that adheres the first bonding pad of the light source portion to the heat dissipation plate; and a second adhesive member that adheres the second bonding pad of the light source portion to the pad of the circuit board,
wherein at least one of the first and second adhesive members is made of an electrically conductive material.

6. The lighting device of claim 1, comprising:
a light guide module coupled to the heat dissipation plate and covering the light source portion,
wherein the light guide module includes a support portion coupled to the heat dissipation plate and spaced apart from the light source portion; and a light guide portion protruding from the support portion,
wherein the light guide portion overlaps the light source portion in a vertical direction,
wherein the light guide portion has a pillar shape and has an upper surface with an area larger than an upper surface area of the light source portion.

7. A lighting device comprising:
a heat dissipation plate;
a circuit board disposed on the heat dissipation plate and having a concave recess portion on one side;
a plurality of pads disposed on one side of the circuit board;
a light source portion disposed on the heat dissipation plate and having a light emitting device and a plurality of bonding pads; and
a plurality of connection members respectively connecting the plurality of pads to the plurality of bonding pads,
wherein at least a portion of the light source portion is inserted into the recess portion of the circuit board.

8. The lighting device of claim 7,
wherein the light source portion has a light emitting device disposed on one side and first and second bonding pads disposed on the other side,
wherein the pads of the circuit board include first and second pads disposed on an outside of the recess portion,
wherein the first pad faces at least two side surfaces of the first bonding pad,
wherein the second pad faces at least two side surfaces of the second bonding pad.

9. The lighting device of claim 7,
wherein the recess portion is concave from one side of the circuit board to the other side,
wherein a depth of the recess portion is 30% or more of a length of the light source portion in a first direction.

10. The lighting device of claim 7, comprising:
an adhesive member disposed between the light source portion and the heat dissipation plate,
wherein at least a portion of the plurality of connection members is disposed on the recess portion,
wherein a portion of the adhesive member protrudes into a gap between the light source portion and the circuit board,
wherein a portion of each of the plurality of connection members protrudes into the gap between the light source portion and the heat dissipation plate.

11. The lighting device of claim 7,
wherein the plurality of connection members is an adhesive member made of electrically conductive members.

12. The lighting device of claim 7,
wherein the plurality of connection members includes a first connection member electrically connecting the first bonding pad to the first pad, and a second connection member electrically connecting the second bonding pad to the second pad,
wherein each of the first and second connection members extends in a straight line from one end to the other.

13. The lighting device of claim 7,
wherein the plurality of connection members includes a first connection member electrically connecting the first bonding pad to the first pad, and a second connection member electrically connecting the second bonding pad to the second pad,
wherein the first connection member is in contact with a surface of the first pad from a surface of the first bonding pad, extends along an upper surface of the light source portion and an upper surface of the circuit board, and
wherein the second connection portion is in contact with a surface of the second pad from a surface of the second bonding pad and extends along the upper surface of the light source part and the upper surface of the circuit board.

14. The lighting device of claim 7,
wherein the plurality of connection members includes a first connection member electrically connecting the first bonding pad to the first pad, and a second connection member electrically connecting the second bonding pad to the second pad,
wherein each of the first and second connection members includes one end bonded to the first and second bonding pads, the other end bonded to the first and second pads, respectively, and a center portion extending from the one end to the other end, and
wherein the center portion extends from the other side of the light source portion to an inside of the circuit board through a region of the recess portion.

15. The lighting device of claim 14,
wherein a height of the center portion of the first and second connection members is a height between heights of the one end and the other end.

16. The lighting device of claim 14,
wherein a height of the center portion of the first and second connection members is the same as heights of the one end and the other end.

17. The lighting device of claim 14,
wherein a width of the center portion of the first and second connection members is equal to or less than a width of the one end and the other end.

18. The lighting device of claim 14, comprising:
a gap between the light source portion and the circuit board is in a range of 0.4 mm to 0.6 mm.

19. The lighting device of claim 14, comprising:
a resin portion disposed in a gap between the light source portion and the circuit board.

20. The lighting device of claim 7, comprising:
an adhesive member disposed between the light source portion and the heat dissipation plate,
wherein a portion of the adhesive member protrudes into a gap between the light source portion and the circuit board,
wherein a portion of the adhesive member protrudes in a range of 0.4 mm to 0.6 mm with respect to a bottom of the light source portion.

* * * * *